(12) United States Patent
Birowosuto et al.

(10) Patent No.: US 11,733,404 B2
(45) Date of Patent: Aug. 22, 2023

(54) APPARATUS FOR RADIATION DETECTION

(71) Applicants: NANYANG TECHNOLOGICAL UNIVERSITY, Singapore (SG); THALES SOLUTIONS ASIA PTE LTD, Singapore (SG); CENTRE NATIONAL DE LA RECHERCHE SCIENTIFIQUE, Paris (FR)

(72) Inventors: Muhammad Danang Birowosuto, Singapore (SG); Daniele Cortecchia, Singapore (SG); Cesare Soci, Singapore (SG)

(73) Assignees: NANYANG TECHNOLOGICAL UNIVERSITY, Singapore (SG); THALES SOLUTIONS ASIA PTE LTD, Singapore (SG); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 581 days.

(21) Appl. No.: 16/321,159

(22) PCT Filed: Jul. 28, 2017

(86) PCT No.: PCT/SG2017/050386
§ 371 (c)(1),
(2) Date: Jan. 28, 2019

(87) PCT Pub. No.: WO2018/021975
PCT Pub. Date: Feb. 1, 2018

(65) Prior Publication Data
US 2020/0209414 A1   Jul. 2, 2020

(30) Foreign Application Priority Data
Jul. 28, 2016 (SG) .......................... 10201606250W

(51) Int. Cl.
*G01T 1/202* (2006.01)
*C09K 11/06* (2006.01)
(Continued)

(52) U.S. Cl.
CPC ............ *G01T 1/2023* (2013.01); *C09K 11/06* (2013.01); *G01T 1/2006* (2013.01);
(Continued)

(58) Field of Classification Search
CPC ..... G01T 1/2023; G01T 1/2006; G01T 1/202; G01T 1/20; H01G 9/2009; H01L 27/308;
(Continued)

(56) References Cited

U.S. PATENT DOCUMENTS 10,087,366 B2 * 10/2018 Dohner .................. C09K 11/08
2004/0084654 A1   5/2004 Shibuya et al.
(Continued)

FOREIGN PATENT DOCUMENTS

JP     2006170827 A   6/2006
WO   2015061555 A1   4/2015
(Continued)

OTHER PUBLICATIONS

Cornu et al., "Luminescence of sensitive materials: towards new optical sensing," 2015, SPIE Proceedings, vol. 9364, pp. 936416-1 to 936416-7 (Year: 2015).*
(Continued)

*Primary Examiner* — Kiho Kim

(57) ABSTRACT

An is disclosed. The apparatus comprises a two-dimensional perovskite having a polaronic emission Stokes' shifted by at least 50 nm to minimise loss due to re-absorption.

14 Claims, 15 Drawing Sheets

(51) Int. Cl.
  *G01T 1/20* (2006.01)
  *H01G 9/20* (2006.01)
  *H10K 30/30* (2023.01)
  *H10K 39/36* (2023.01)

(52) U.S. Cl.
  CPC ........... *H01G 9/2009* (2013.01); *H10K 30/30* (2023.02); *H10K 39/36* (2023.02)

(58) Field of Classification Search
  CPC ... H01L 51/4253; H01L 31/085; C09K 11/06; C09K 11/664; Y02E 10/542; G21K 4/00
  See application file for complete search history.

(56) References Cited

U.S. PATENT DOCUMENTS

| | | | | |
|---|---|---|---|---|
| 2008/0093557 | A1* | 4/2008 | Cooke | H01L 31/02161 250/361 R |
| 2016/0251303 | A1* | 9/2016 | Moore | C23C 18/1245 428/220 |
| 2016/0289554 | A1* | 10/2016 | Dohner | C09K 11/66 |
| 2017/0021321 | A1* | 1/2017 | Konstandopoulos | ... C01B 3/063 |
| 2017/0053746 | A1* | 2/2017 | Belcher | H01L 51/424 |
| 2019/0140181 | A1* | 5/2019 | Huang | H01L 31/18 |
| 2019/0162865 | A1* | 5/2019 | Huang | C30B 29/12 |

FOREIGN PATENT DOCUMENTS

| | | |
|---|---|---|
| WO | 2016021402 A1 | 2/2016 |
| WO | 2018021975 A1 | 2/2018 |

OTHER PUBLICATIONS

Blasse, G., Scintillator materials, Chem. Mater. 6, 1465-1475 (1994).
Nikl, M., Scintillation detectors for x-rays, Meas. Sci. Technol. 17, R37-R54 (2006).
Street, R. A., Ready, S. E., Van Schuylenbergh, K., Ho, J., Boyce, J. B., Nylen, P., Shah, K., Melekhov, L., and Hermon, H., Comparison of PbI2 and HgI2 for direct detection active matrix x-ray image sensors, J. Appl. Phys. 91, 3345-3355 (2002).
Szeles, C., CdZnTe and CdTe materials for X-ray and gamma ray radiation detector applications, phys. stat. sol. (b) 241, 783-790 (2004).
Kasap, S. and Rowlands, J., Direct-conversion flat-panel X-ray image sensors for digital radiography, Proc. IEEE 90, 591-604 (2002).
Büchele, P., Richter, M., Tedde, S. F., Matt, G. J., Ankah, G. N., Fischer, R., Biele, M., Metzger, W., Lilliu, S., Bikondoa, O., Macdonald, J. E., Brabec, C. J., Kraus, T., Lemmer, U., and Schmidt, O., X-ray imaging with scintillator-sensitized hybrid organic photodetectors, Nature Photon. 9, 843-848 (2015).
Heiss, W. and Brabec, C., X-ray imaging: Perovskites target X-ray detection, Nature Photon. 10, 288-289 (2016).
Tegze, M. and Faigel, G., X-ray holography with atomic resolution, Nature 380, 49-51 (1996).
Rieder, R., Economou, T., Wanke, H., Turkevich, A., Crisp, J., Bruckner, J., Dreibus, G., and McSween, H., The chemical composition of Martian soil and rocks returned by the mobile alpha proton x-ray spectrometer: Preliminary results from the x-ray mode, Science 278, 1771-1774 (1997).
Yakunin, S., Sytnyk, M., Kriegner, D., Shrestha, S., Richter, M., Matt, G. J., Azimi, H.,Brabec, C. J., Stangl, J., Kovalenko, M. V., and Heiss, W., Detection of X-ray photons by solution-processed lead halide perovskites, Nature Photon. 9, 444-450 (2015).
Wei, H., Fang, Y., Mulligan, P., Chuirazzi, W., Fang, H.-H., Wang, C., Ecker, B. R., Gao, Y., Loi, M. A., Cao, L., and Huang, J., Sensitive X-ray detectors made of methylammonium lead tribromide perovskite single crystals, Nature Photon. 10, 333-339 (2016).
Yakunin, S., Dirin, D. N., Shynkarenko, Y., Morad, V., Cherniukh, I., Nazarenko, O., Kreil, D., Nauser, T., and Kovalenko, M. V., Detection of gamma photons using solution-grown single crystals of hybrid lead halide perovskites, Nature Photon. AOP (2016).
Chin, X.Y., Cortecchia, D., Yin, J., Bruno, A., and Soci, C., Lead iodide perovskite light-emitting field-effect transistor, Nature Comm. 6, 7383-1-7383-9 (2015).
Dou, L., Yang, Y. M., You, J., Hong, Z., Chang, W.H., Li, G., and Yang, Y., Solution-processed hybrid perovskite photodetectors with high detectivity, Nature Comm. 5, 5404-1-5404-6 (2014).
Chondroudis, K. and Mitzi, D. B., Electroluminescence from an organic-inorganic perovskite incorporating a quaterthiophene dye within lead halide perovskite layers, Chem. Mater. 11, 3028-3030 (1999).
Tan, Z.-K., Moghaddam, R. S., Lai, M. L., Docampo, P., Higler, R., Deschler, F., Price, M., Sadhanala, A., Pazos, L. M., Credgington, D., Hanusch, F., Bein, T., Snaith, H. J., and Friend, R. H., Bright light-emitting diodes based on organometal halide perovskite, Nature Nanotech. 9, 687-692 (2014).
Xing, G., Mathews, N., Lim, S. S., Yantara, N., Liu, X., Sabba, D., Gratzel, M., Mhaisalkar, S.and Sum, T. C., Low-temperature solution-processed wavelength-tunable perovskites for lasing. Nature Mater. 13, 476-480 (2014).
Birowosuto, M. D. and Dorenbos, P., Novel γ- and X-ray scintillator research: on the emission wavelength, light yield and time response of Ce3+ doped halide scintillators, phys. stat. sol. (a) 206, 9-20 (2009).
Drozdowski, W., Wojtowicz, A. J., Lukasiewicz, T., and Kisielewski, J., Scintillation properties of LuAP and LuYAP crystals activated with Cerium and Molybdenum, Nucl. Instr. Meth. Phys. Res. A 562, 254-261 (2006).
Shibuya, K., Koshimizu, M., Takeoka, Y., and Asai, K., Scintillation properties of (C6H13NH3)(2)PbI4: Exciton luminescence of an organic/inorganic multiple quantum well structure compound induced by 2.0 MeV protons, Nucl. Instr. Meth. Phys. Res. B 194, 207-212 (2002).
Kishimoto, S., Shibuya, K., Nishikido, F., Koshimizu, M., Haruki, R., and Yoda, Y., Subnanosecond time-resolved x-ray measurements using an organic-inorganic perovskite scintillator, Appl. Phys. Lett. 93, 261901-1-261901-3 (2008).
Saidaminov, M. I., Abdelhady, A. L., Murali, B., Alarousu, E., Burlakov, V. M., Peng, W., Dursun, I., Wang, L., He, Y., Maculan, G., Goriely, A., Wu, T., Mohammed, O. F., and Bakr, O. M., High-quality bulk hybrid perovskite single crystals within minutes by inverse temperature crystallization, Nature Comm. 6, 7586-1-7586-6 (2015).
Shi, D., Adinolfi, V., Comin, R., Yuan, M., Alarousu, E., Buin, A., Chen, Y., Hoogland, S., Rothenberger, A., Katsiev, K., Losovyj, Y., Zhang, X., Dowben, P. A., Mohammed, O. F., Sargent, E. H., and Bakr, O. M., Low trap-state density and long carrier diffusion in organolead trihalide perovskite single crystals, Science 347, 519-522 (2015).
Dohner, E. R., Jaffe, A., Bradshaw, L. R., and Karunadasa, H. I., Intrinsic white-light emission from layered hybrid perovskites, J. Am. Chem. Soc. 136, 13154-13157 (2014).
Van Loef, E. V. D., Dorenbos, P., van Eijk, C. W. E., Krämer, K. and Güdel, H. U., High-energy-resolution scintillator: Ce3+ activated LaBr3, Appl. Phys. Lett. 79, 1573-1-1573-3 (2001).
Birowosuto, M. D., Dorenbos, P., van Eijk, C. W. E., Krämer, K. W., and Güdel, H. U., Thermal quenching of Ce3+ emission in PrX3 (X=Cl, Br ) by intervalence charge transfer, J. Phys. Condens. Matter 19, 256209-1-256209-16 (2007).
Birowosuto, M. D., Dorenbos, P., de Haas, J. T. M., van Eijk, C. W. E., Krämer, K. W., and Güdel, H. U., Optical spectroscopy and luminescence quenching of LuI3: Ce3+, J. Lumin. 118, 308-316 (2006).
Birowosuto, M. D., Dorenbos, P., van Eijk, C. W. E., Krämer, K. W., and Güdel, H. U., High-light-output scintillator for photodiode readout: LuI3: Ce3+, J. Appl. Phys. 99, 123520-1-123520-4 (2006).
D. Cortecchia et al, J. Mater. Chem. C, 5, 2771-2780 (2017).
Birowosuto, M. D., Dorenbos, P., van Eijk, C. W. E., Krämer, K. W., and Güdel, H. U., PrBr3: Ce3+: A New Fast Lanthanide Trihalide Scintillator, IEEE Trans. Nucl. Sci. 53, 3028-3030 (2006).
Van Eijk, C. W. E., de Haas, J. T. M., Rodnyi, P. A., Khodyuk, I. V., Shibuya, K., Nishikido, F., and Koshimizu, M., Scintillation prop-

(56) References Cited

OTHER PUBLICATIONS erties of a crystal of (C6H5(CH2)2NH3)2PbBr4, IEEE Nuclear Science Symposium Conference Record 2008, 3525-3528 (2008).

Bartram, R. H., Hamilton, D. S., Kappers, L., and Lempicki, A., Electron traps and transfer efficiency of cerium-doped aluminate scintillators, J. Lumin 75, 183-192 (1997).

Drozdowski, W., Brylew, K., Witkowski, M. E., Wojtowicz, A. J., Solarz, P., Kamada, K., and Yoshikawa, A., Studies of light yield as a function of temperature and low temperature thermoluminescence of Gd3Al2Ga3O12: Ce scintillator crystals, Opt. Mater. 36, 1665-1669 (2014).

Randall, J., and Wilkins, M., The phosphorescence of various solids, Proc. Roy. Soc. London A 184, 347-364 (1945).

Wojtowicz, A. J., Glodo, J., Drozdowski, W., and Przegietka, K. R., Electron traps and scintillation mechanism in YAlO3: Ce and LuAlO3: Ce scintillators J. Lumin. 79, 275-291 (1998).

Ogorodnikov, I. N. and Poryvai, N. E., Thermoluminescence kinetics of lithium borate crystals, J. Lumin. 132, 1318-1324 (2012).

Liu, C., Qi, Z., Ma, C.-g., Dorenbos, P., Hou, D., Zhang, S., Kuang, X., Zhang, J., and Liang, H., High light yield of Sr8(Si4O12)Cl8: Eu2+ under x-ray excitation and its temperature-dependent luminescence characteristics Chem. Mater. 26, 3709-3715 (2014).

Sutter-Fella, C. M., Li, Y., Amani, M., Ager III, J. W., Toma, F. M., Yablonovitch, E., Sharp, I. D., and Javey, A., High photoluminescence quantum yield in band gap tunable bromide containing mixed halide perovskites, Nano Lett. 16, 800-806 (2016).

Kolk, E. V. D. and Dorenbos, P., Systematic and material independent variation of electrical, optical, and chemical properties of Ln materials over the Ln series ( Ln ) La, Ce, Pr, ..., Lu, Chem. Mater. 18, 3458-3462 (2006).

Birowosuto, M. D., Dorenbos, P., van Eijk, C. W. E., Krämer, K. W., and Güdel, H. U., Ce3+ activated LaBr3-xIx : High-light-yield and fast-response mixed halide scintillators, J. Appl Phys. 103, 103517-1-103517-6 (2008).

Cortecchia, D., Dewi, H. A., Yin, J., Bruno, A., Chen, S., Baikie, T., Boix, P. P., Grätzel, M., Mhaisalkar, S., Soci, C., and Mathews, N., Inorganic Chemistry 2016, 55, 1044.

Ahmad, S., Kanaujia, P. K., Beeson, H. J., Abate, A., Deschler, F., Credgington, D., Steiner, U., Prakash, G. V., and Baumberg, J. J., ACS Applied Materials & Interfaces 2015, 7, 25227.

Birowosuto, M. D., Cortecchia, D., Drozdowski, W., Brylew, K., Lachmanski, W., Bruno, A., and Soci, C., X-ray Scintillation in Lead Halide Perovskite Crystals Scientific Reports 6, 37254 (2016).

D. Cortecchia et al, J. Am. Chem. Soc., 139 (1), pp. 39-42 (2017).

J. Yin et al, ACS Energy Lett., 2 (2), pp. 417-423 (2017).

Foreign Communication from a Related Counterpart Application, International Search Report and Written Opinion dated Sep. 18, 2017, International Application No. PCT/SG2017/050386 filed on Jul. 28, 2017.

Dohner, E. R. et al., Intrinsic White-Light Emission from Layered Hybrid Perovskites. J. Am. Chem. Soc., Aug. 27, 2014, vol. 136, No. 38, pp. 13154-13157 [Retrieved on Sep. 4, 2017] <DOI: 10.1021/JA507086B>.

Dou, L. et al., Atomically thin two-dimensional organic-inorganic hybrid perovskites. Science, Sep. 25, 2015, vol. 349, No. 6255, pp. 1518-1521 [Retrieved on Sep. 4, 2017] <DOI: 10.1126/SCIENCE.AAC7660>.

Ahmad, S. et al., Strong Photocurrent from Two-Dimensional Excitons in Solution-Processed Stacked Perovskite Semiconductor Sheets. ACS Appl. Mater. Interfaces, Oct. 26, 2015, vol. 7, No. 45, pp. 25227-25236 [Retrieved on Sep. 4, 2017] <DOI: 10.1021/ACMSAMI.5B07026>.

Foreign Communication from a Related Counterpart Application, Extended European Search Report dated Feb. 11, 2020, International Application No. PCT/SG2017/050386 filed on Jul. 28, 2017.

Shibuya K et al: "Scintillation properties of (C"6H 13NH"3)"2PbI"4: Exciton luminescence of an organic/inorganic multiple quantum well structure compound induced by 2.0 MeV protons", Nuclear Instruments & Methods in Physics Research. Section B: Beam Interactions With Materials and Atoms, Elsevier BV, NL, vol. 194, No. 2, Aug. 1, 2002 (Aug. 1, 2002), pp. 207-212, XP004372723, ISSN: 0168-583X, DOI: 10.1016/S0168-583X(02)00671-7.

R Haruki et al: "Investigation on new scintillators for subnanosecond time-resolved x-ray measurements", Journal of Physics: Conference Series, vol. 217, Mar. 1, 2010 (Mar. 1, 2010), p. 012007, XP055664014, DOI: 10.1088/1742-6596/217/1/012007.

Wolfgang Heiss et al: "news & views X-Ray Imaging Perovskites target X-ray detection", May 11, 2016 (May 11, 2016), pp. 288-290, XP055663771, Retrieved from the Internet: URL:https://www.nature.com/articles/nphoton.2016.54.pdf [retrieved on Jan. 30, 2020].

Emma R. Dohner et al: "Self-Assembly of Broadband White-Light Emitters", Journal of the American Chemical Society, vol. 136, No. 5, Jan. 23, 2014 (Jan. 23, 2014), pp. 1718-1721, XP055663758, ISSN 0002-7863, DOI: 10.1021/ja411045r.

Shunji Kishimoto et al: "Fast scintillation detectors for high-energy X-ray region", Hyperfine Interactions, Kluwer Academic Publishers, DO, vol. 204, No. 1-3, Jan. 3, 2012 (Jan. 3, 2012), pp. 101-110, XP035041403, ISSN: 1572-9540, DOI: 10.1007/S10751-011-0543-X.

Foreign Communication from a Related Counterpart Application, European Office Action dated Jan. 28, 2021, European Application No. 17834878.5 filed on Jul. 28, 2017.

Foreign Communication from a Related Counterpart Application, Korean Office Action dated Nov. 22, 2021, Korean Application No. 20190046820 filed on May 7, 2019.

\* cited by examiner

FIG. 1A
FIG. 1B
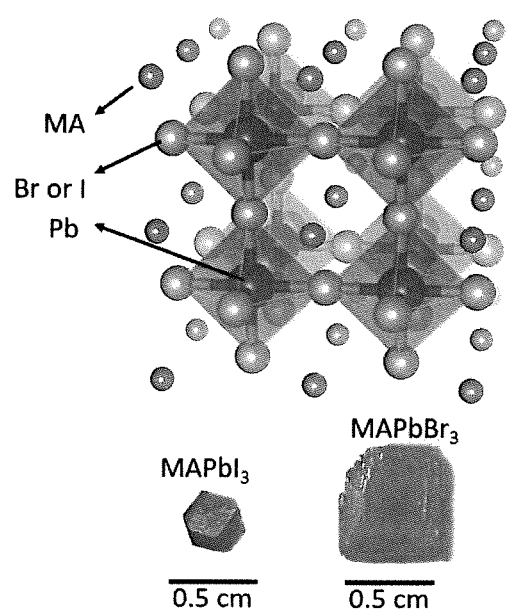
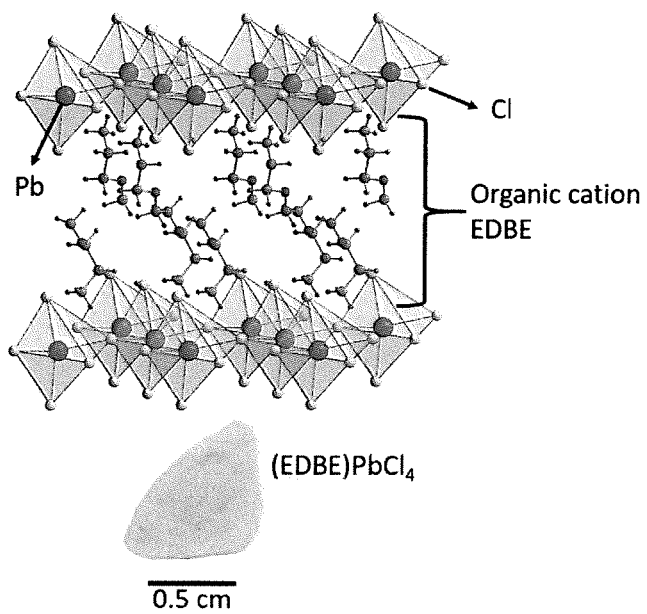
FIG. 1C    FIG. 1D      FIG. 1E

FIG. 9A      FIG. 9B      FIG. 9C
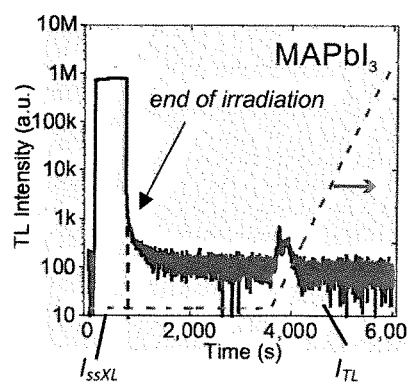 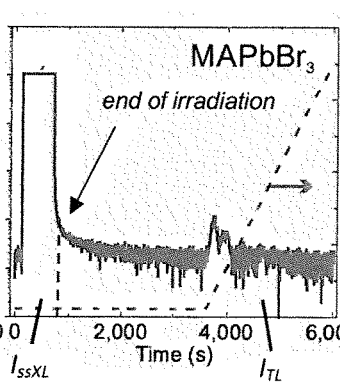 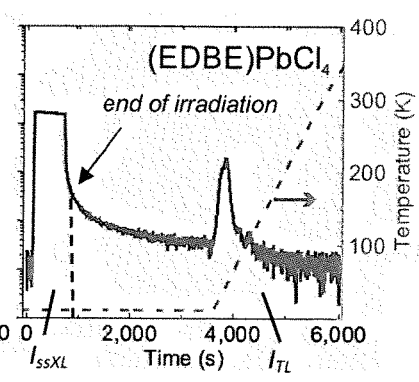
FIG. 10A      FIG. 10B      FIG. 10C
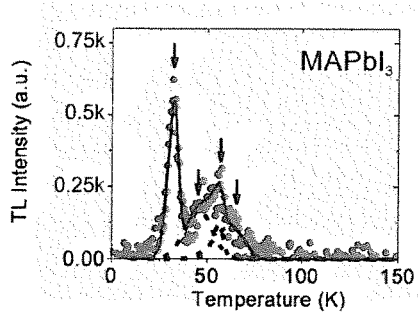 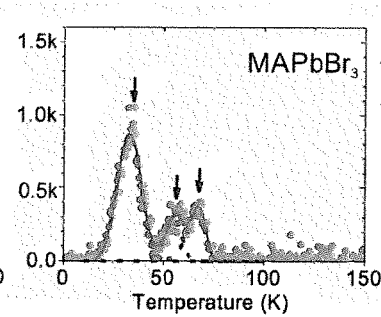 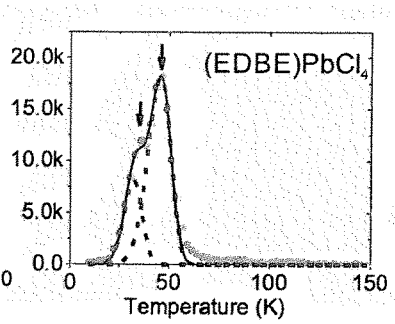

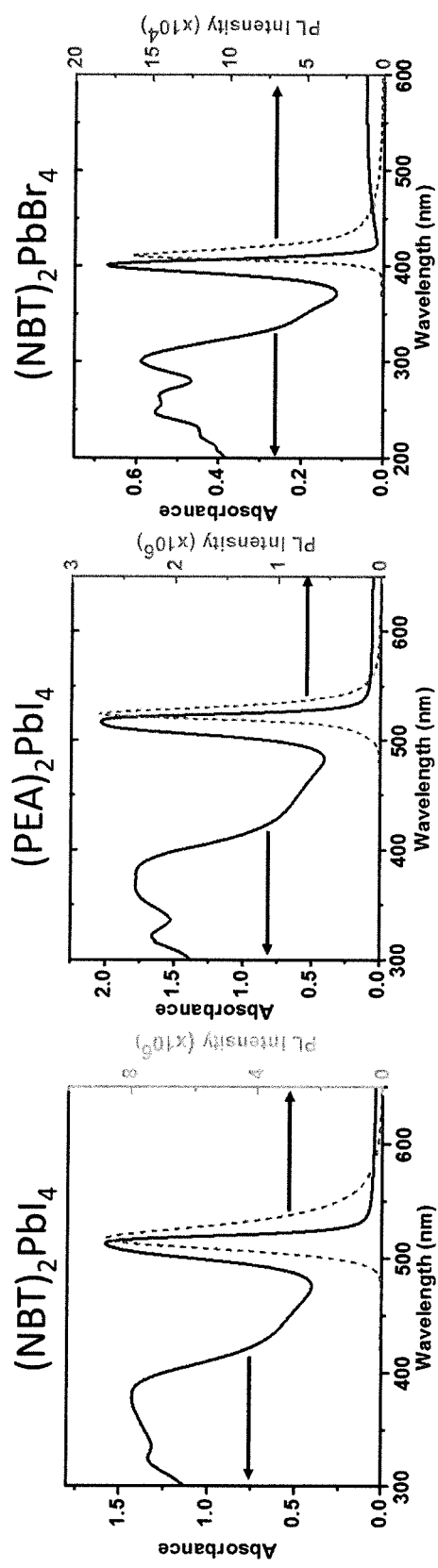

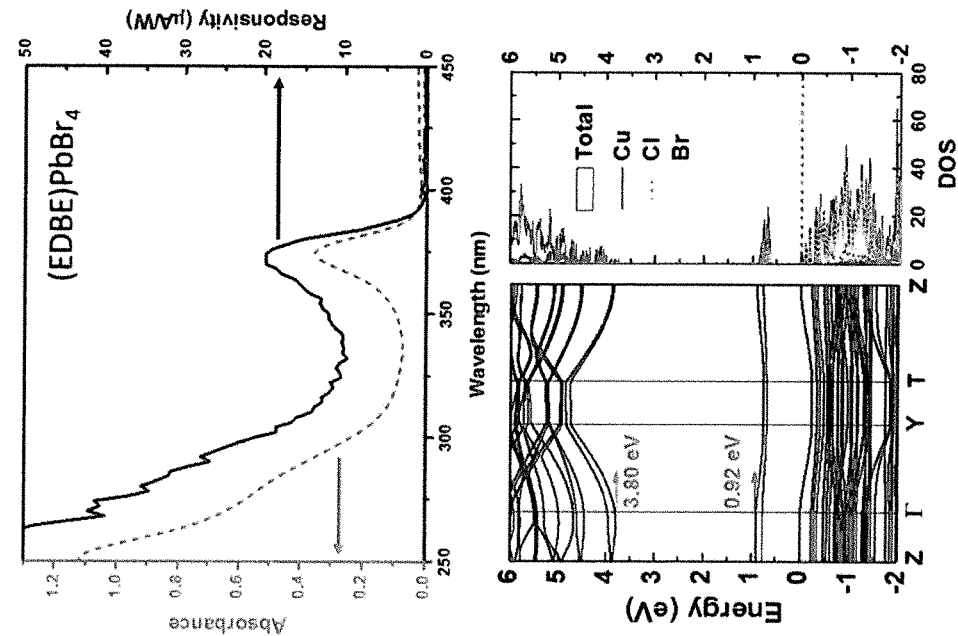
FIG. 17A
FIG. 17B
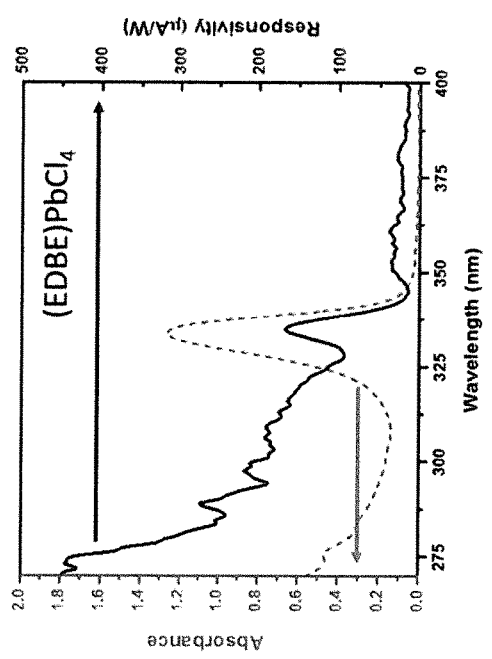
FIG. 17C
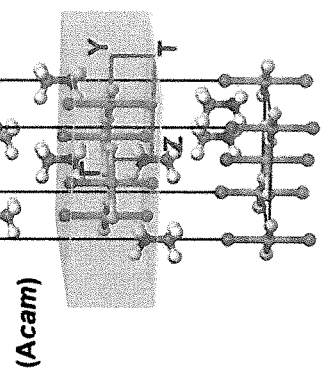
FIG. 17D

APPARATUS FOR RADIATION DETECTION

CROSS-REFERENCE TO RELATED APPLICATIONS

The present application is a filing under 35 U.S.C. 371 as the National Stage of International Application No. PCT/SG2017/050386, filed Jul. 28, 2017, entitled "APPARATUS FOR ELECTRO-MAGNETIC WAVE DETECTION," which claims priority to Singapore Application No. SG 10201606250W filed with the Intellectual Property Office of Singapore on Jul. 28, 2016," both of which are incorporated herein by reference in their entirety for all purposes.

FIELD OF THE INVENTION

The present invention relates to an apparatus for detection of electro-magnetic waves, in particular, for detection of X-rays or gamma rays. The apparatus may be in the form of a scintillator or a photo-detector.

BACKGROUND

Detection of electro-magnetic waves or radiations has been at the forefront of research. In particular, there is a continued interest in X-ray detectors (see e.g. references 3 to 7) due to their wide range of applications, ranging from crystallography (see e.g. reference 8) to space exploration (see e.g. reference 9). At the same time, recent demonstrations of the use of hybrid metal-halide perovskites for X- and γ-ray detection has spurred great interest in this class of materials (see e.g. references 7, 10, 11 and 12). Besides their good detection efficiency, hybrid metal-halide perovskites can be solution-processed and thus have huge potential for facile integration and development in industrial and biomedical applications.

Generally, modern X-ray detectors rely on two main mechanisms of energy conversion. The first is photon-to-current conversion in which a semiconducting material directly converts an incoming radiation into an electrical current (see e.g. references 4 to 6), and the second is X-ray to UV-visible photon down-conversion in which a scintillator material is coupled to a sensitive photo-detector operating at lower photon energies (see e.g. reference 2).

An example of a three-dimensional hybrid metal-halide perovskites for X-ray detection using photon-to-current conversion is methylammonium lead trihalide perovskites ($MAPbX_3$ where $MA=CH_3NH_3$ and $X=I$, Br, or Cl). As X-ray detectors, $MAPbX_3$ yield notably large X-ray absorption cross section due to large atomic numbers of the heavy Pb and I, Br, Cl atoms (see e.g. references 10 and 11). Thin-film $MAPbX_3$ p-i-n photodiode and lateral photoconductor devices have shown good efficiency for X-ray photon-to-current conversion (see e.g. references 10 and 11). However, thin-film X-ray detectors typically have low responsivity at high (keV) photon energies, where the absorption length (~mm) is much larger than the film thickness (~µm). Even if thickness is increased to improve detection probability, direct photon-to-current conversion is ultimately hampered by the limited carrier-diffusion length (~1 µm in perovskites) (see e.g. reference 10). Efficient X-ray photon-to-current conversion has been shown recently in single-crystal (thick) three-dimensional perovskite $MAPbBr_3$, but sensitivity is still limited to energies up to 50 keV (see e.g. reference 11).

On the other hand, X-ray scintillators do not suffer from limited carrier diffusion length of the absorbing material (see e.g. references 18 and 19). For example, X-ray scintillators using $MAPbX_3$ has been shown previously by e.g. Canadian Patent CA 2 434 091. However, three-dimensional perovskites such as $MAPbX_3$ suffer from thermal quenching of X-ray excited luminescence and a low light yield which leads to poorer performing and less efficient scintillators. In addition, low-dimension thin films of phenethylammonium lead bromide, $PhE-PbBr_4$, with sub-nanosecond scintillation decay time have been previously tested in X-ray (see e.g. reference 20) and proton scintillators (see e.g. reference 21). However, these scintillators only yielded 5-6% detection efficiency of 60 keV X-rays due to limitations by the film thickness (200 µm) (see e.g. reference 21).

It is therefore an aim of the present invention to provide an improved apparatus for electro-magnetic wave detection that helps to ameliorate one or more of the above problems.

SUMMARY OF THE INVENTION

Aspects of the present invention relate to use of two-dimensional hybrid perovskites for electro-magnetic wave detection in the form of a scintillator or a photo-detector.

In accordance with a first aspect of the invention there is provided an apparatus for electro-magnetic wave detection (e.g. an electro-magnetic wave detector) comprising:
a two-dimensional perovskite having a polaronic emission Stokes' shifted by at least 50 nm to minimise loss due to re-absorption.

An electro-magnetic wave detector comprising a two-dimensional perovskite is far more robust against thermal quenching than a three-dimensional perovskite due to its large exciton binding energy (-360 meV) induced by charge confinement within the inorganic layers. Moreover, a two-dimensional perovskite with a large Stokes' shift minimises loss due to re-absorption. As such, an electro-magnetic wave detector comprising a two-dimensional perovskite with a large Stokes' shift has a relatively large light yield and a short decay time which are desirable characteristics of a high performance electro-magnetic wave detector. Such a two-dimensional perovskite may also exhibit broadband polaronic emission which may also be desirable.

In an embodiment, the two-dimensional perovskite has a scintillation decay time of less than 8 ns; less than 7 ns; less than 6 nm; or less than 5 nm at room temperature.

In an embodiment, the electro-magnetic wave detector is configured as a scintillator.

In an embodiment, the electro-magnetic wave detector is configured as a photo-detector.

In an embodiment, the two-dimensional perovskite is in the form of a single crystal.

In an embodiment, the two-dimensional perovskite is in the form of a film, for example a thin film.

In an embodiment, the electro-magnetic detector comprises a cation selected from the group of: EDBE; N-MEDA; API; AETU or CEA.

In an embodiment, the electro-magnetic detector comprises one or more of: a halide; a Group IVa metal; a transition metal; a post-transition metal; or a lanthanide.

In an embodiment, the two-dimensional perovskite is a layered hybrid perovskite of the Ruddlesden-Popper series with a general formula of $(A)_2(B)_{n-1}[Pb_nX_{3n+1}]$, where A is a bulky cation, B is a small cation and X is an anion.

In an embodiment, the two-dimensional perovskite has a polaronic emission Stokes' shifted by at least 100 nm; at least 200 nm or at least 300 nm.

In an embodiment, the electro-magnetic detector comprises lateral contacts formed in a direction parallel to a layered structure of the two-dimensional perovskite.

In an embodiment, the two-dimensional perovskite is doped with a functional organic cation and the electromagnetic wave detector comprises vertical contacts formed in a direction orthogonal to a layered structure of the two-dimensional perovskite.

The electro-magnetic wave detector may be configured for broadband luminescence with a full width at half maximum (FWHM) of at least 50 nm or at least 100 nm.

Thus, embodiments of the present invention provide an apparatus for electromagnetic wave detection which is able to detect electromagnetic waves across a broad range of temperatures. This is provided by the use of two-dimensional perovskites which are far more robust against thermal quenching due to their large exciton binding energy (~360 meV) induced by charge confinement within the inorganic layers. Moreover, two-dimensional perovskites with a large Stokes' shift minimise loss due to re-absorption. As such, electro-magnetic wave detectors comprising two-dimensional perovskites with a large Stokes' shift have relatively large light yield and short decay times which are desirable characteristics of high performance electro-magnetic wave detectors. Such two-dimensional perovskites may also exhibit polaronic broadband emission which may also be desirable.

BRIEF DESCRIPTION OF THE DRAWINGS

Embodiments of the invention will now be described, by way of example only, with reference to the following drawings, in which:

FIG. 1 shows the crystal structures and appearances of three-dimensional perovskites $MAPbX_3$ (X=I, Br) and a two-dimensional perovskite $(EDBE)PbCl_4$ according to the present invention. More specifically, FIGS. 1A and 1B show the crystal structures of $MAPbX_3$ (X=I, Br) three-dimensional perovskites and $(EDBE)PbCl_4$ two-dimensional perovskite respectively, while FIGS. 1C, 1D, and 1E show the appearances of $MAPbX_3$ (X=I, Br) three-dimensional perovskites and $(EDBE)PbCl_4$ two-dimensional perovskite;

FIGS. 9A, 9B, and 9C show low temperature thermoluminescence curves of a) $MAPbI_3$, b) $MAPbBr_3$, and c) $(EDBE)PbCl_4$;

FIGS. 10A, 10B, and 10C show glow curves of a) $MAPbI_3$, b) $MAPbBr_3$, and c) $(EDBE)PbCl_4$;

FIGS. 15A, 15B, and 15C show steady state absorption and luminescence of narrowband emitters using a) $(NBT)_2PbI_4$, b) $(PEA)_2PbI_4$ and c) $(NBT)_2PbBr_4$ respectively;

FIGS. 17A, 17B, 17C, and 17D shows examples of properties of two-dimensional perovskites in relation to their use as photovoltaics and/or photo-detectors in accordance with an embodiment of the present invention. More specifically, (a) and (b) of FIG. 17 show UV-induced photocurrent measurements on $(EDBE)PbCl_4$ and $(EDBE)PbBr_4$ drop casted films respectively, while (c) and (d) of FIG. 17 illustrate the crystal and band structure obtained from ab-initio calculations of a layered copper perovskite $MA_2CuClBr_3$ respectively;

DETAILED DESCRIPTION

Figure 2:
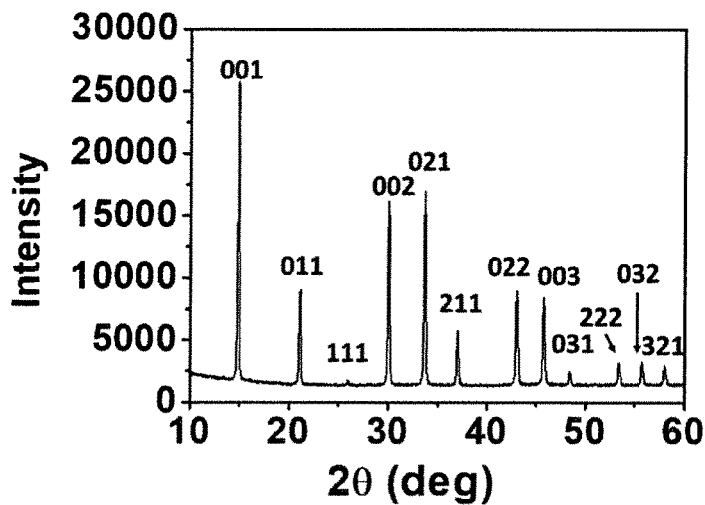
FIG. 2 shows an X-ray diffraction (XRD) pattern of $MAPbBr_3$ powders.

The present invention aims to demonstrate novel applications of two-dimensional perovskite materials with large polaronic Stokes' shifts for an electro-magnetic wave detector in the form of a scintillator or a photodetector. As examples, comparisons have been drawn between a two-dimensional perovskite (e.g. $(EDBE)PbCl_4$) and two three-dimensional perovskites (e.g. $MAPbI_3$ and $MAPbBr_3$) to illustrate the superior qualities of two-dimensional perovskites for use as electro-magnetic wave detectors. In particular embodiments, the two-dimensional perovskite may be applied as a single crystal or a film (e.g. a thin film).

Generally, as a result of a good high-energy response with a large absorption cross-section derived from a large thickness and a high mass-density, scintillators made from single crystal perovskites are expected to have improved detection efficiency for X-rays or γ-rays with energies in the range of keV. Moreover, compared to traditional scintillator crystals (see e.g. reference 6), two-dimensional perovskite crystals produce extremely high light yields of >120,000 photons/MeV (as estimated from X-ray-excited luminescence) at low temperature due to their lower bandgap energies. For comparisons using three-dimensional perovskites, the light yield is greatly reduced at room temperature (<1,000 photons/MeV) due to strong thermal quenching effects. Conversely, two-dimensional perovskite crystals are far more robust against thermal quenching as a result of their large exciton binding energies (~360 meV) induced by charge confinement within the inorganic layers. Moreover, two-dimensional perovskites with a large Stokes' shift minimise loss due to re-absorption. As such, electro-magnetic wave detectors comprising two-dimensional perovskites with a large Stokes' shift have relatively large light yield and short decay times. Therefore, two-dimensional perovskite crystals with large Stokes' shift (e.g. ≥50 nm) have excellent potential for use in high-light yield X-ray scintillators.

In order to study scintillation performance, high-quality and large-size (~30 to 100 mm$^3$) perovskite single crystals have been synthesized.

In an experiment, three-dimensional perovskite precursors, MABr and MAI, were synthetized by mixing hydrobromic acid (48% wt in water) and hydroiodic acid (57% wt in water) with methylamine solution ($CH_3NH_2$, 40% in methanol) in 1:1 molar ratio. The ice-cooled mixture was left under magnetic stirring for 2 hours, and the solvent removed with a rotary evaporator. The resulting powders were dissolved in ethanol, crystallized with diethylether for purification repeating the cycle 6 times, and finally dried in a vacuum oven at 6° C. for 12 hours. For (EDBE)PbCl$_4$ (EDBE=2,2'-(ethylenedioxy)bis(ethylammonium)), the organic precursor (EDBE)Cl$_2$ was synthetised in aqueous solution by a reaction of 2,2'-(ethylenedioxy)bis(ethylamine) (98% in water) with excess HCl (37% in $H_2O$). The solution was stirred for 4 hours at room temperature to complete the reaction. A purification process similar to that was discussed for MABr and MAI was applied to collect the final white and high-purity powders.

For the synthesis of hybrid perovskite crystals, the following inorganic precursors were purchased: lead(II) chloride (PbCl$_2$, 99.999%), lead(II) bromide (PbBr$_2$, 99.999%) and lead(II) iodide (PbI$_2$, 99.0%). Crystals of MAPbBr$_3$ were synthetised using inverse temperature crystallization which has been reported elsewhere (see e.g. reference 27). Two ml of 1M N,N-dimethylformamide (DMF) solution of MABr and PbBr$_2$ (1:1 molar ratio) were left overnight on a hotplate (110° C.) without stirring, allowing the precipitation of the perovskite crystals. MAPbI$_3$ were obtained by slow evaporation at room temperature of a saturate DMF solution of MAI and PbI$_2$ (1:1 molar ratio). To obtain (EDBE)PbCl$_4$ crystals, a 1M solution of (EDBE)Cl$_2$ and PbCl$_2$ (1:1 molar ratio) in dimethylsulphoxide (DMSO) was prepared by dissolving the precursors at 110° C. on a hotplate. After natural cooling of the solution at room temperature, slow crystallization over a period of 1 month results in the formation of cm-scale white perovskite crystals. The crystallization processes were performed under inert $N_2$ atmosphere. All crystals obtained from the above processes were collected from the precursor solutions, washed with diethylether and dried in a vacuum overnight.

FIG. 1 shows the crystal structures and appearances of three-dimensional perovskites MAPbX$_3$ (X=I, Br) and a two-dimensional perovskite (EDBE)PbCl$_4$ for use in embodiments of the present invention. Parts (a) and (b) of FIG. 1 show the crystal structures of MAPbX$_3$ (X=I, Br) three-dimensional perovskites and (EDBE)PbCl$_4$ two-dimensional perovskite respectively, while parts (c), (d) and (e) of FIG. 1 show the appearances of MAPbX$_3$ (X=I, Br) three-dimensional perovskites and (EDBE)PbCl$_4$ two-dimensional perovskite.

As shown in FIG. 1, MAPbX$_3$ (X=I, Br) crystals have a conventional three dimensional ABX$_3$ perovskite structure, consisting of a continuous network of corner sharing PbX$_6^{4-}$ octahedra with methyl-ammonium cations occupying the interstitial sites (see e.g. references 22 and 23). On the other hand, (EDBE)PbCl$_4$ belongs to a general class of APbX$_4$ (X=I, Br, Cl and A=bidentate organic cation) "two-dimensional" perovskite crystals (see e.g. reference 24) where it consists of a stack of <100>-oriented perovskite inorganic layers forming a two-dimensional Pb-X network in alternation with organic sheets of di-ammonium cations EDBE$^{2+}$. Though it may not be obvious from FIG. 1, MAPbI$_3$, MAPbBr$_3$, and (EDBE)PbCl$_4$ crystals appear lustrous black, orange, and white respectively. In addition, the corresponding glows under ultraviolet lamp excitation are green and white for MAPbBr$_3$ and (EDBE)PbCl$_4$ crystals respectively, while the glow of MAPbI$_3$ could not be observed since its emission lies in the near infrared.

Figure 3:
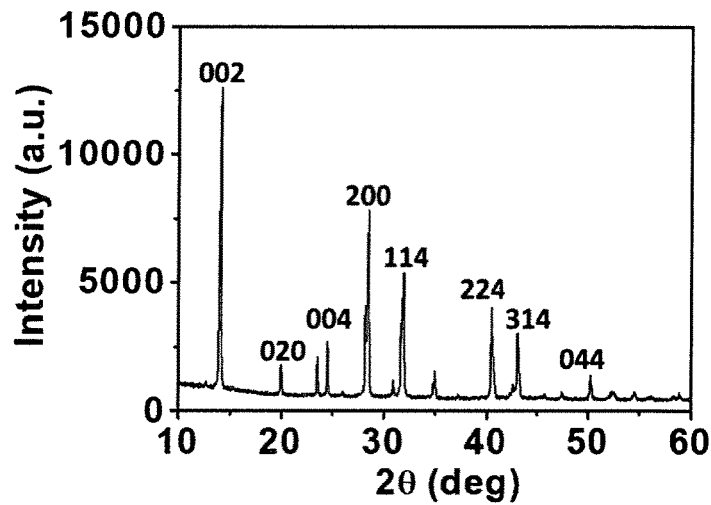
FIG. 3 shows an X-ray diffraction (XRD) pattern of $MAPbI_3$.
Figure 4:
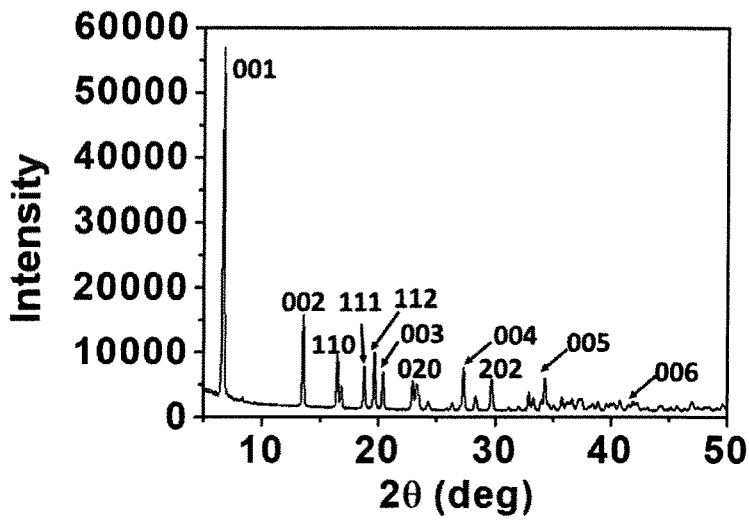
FIG. 4 shows an X-ray diffraction (XRD) pattern of $(EDBE)PbCl_4$ powders for use in an electro-magnetic detector.

FIGS. 2 to 4 show X-ray diffraction (XRD) patterns of the grounded crystals of MAPbBr$_3$, MAPbI$_3$ and (EDBE)PbCl$_4$ respectively. The X-ray diffraction (XRD) was performed on perovskite powders obtained from ground crystals on a BRUKER D8 ADVANCE with Bragg-Brentano geometry using Cu K$_\alpha$ radiation ($\lambda$=1.54,056 Å), with a step increment of 0.02° and 1 second of acquisition time. In particular, FIGS. 2 and 3 show MAPbBr$_3$ and MAPbI$_3$ crystals having a cubic and a tetragonal crystal structure respectively. Accordingly, the XRD pattern of MAPbBr$_3$ is consistent with a perovskite structure having a cubic crystal system, space group Pm3m and lattice parameters a=5.917(1) Å, while the XRD pattern of MAPbI$_3$ is consistent with a perovskite structure having a tetragonal crystal system, space group I4/mcm and lattice constants a=8.867(5) Å and b=12.649(3) Å. FIG. 4 shows presence of pronounced 001 and higher order 001 reflections in the XRD pattern of (EDBE)PbCl$_4$. The 001 reflections indicate the formation of a layered structure in the two-dimensional perovskite, in agreement with a previously reported structure (see e.g. reference 24) having a monoclinic crystal system, space group C2 and refined lattice parameters a=7.762(8) Å, b=7.629(2) Å, c=13.375(7) Å, β=102.7(2) Å). Accordingly, this indicates formation of two-dimensional layered perovskite (EDBE)PbCl$_4$ with a monoclinic crystal structure.

Figure 5:
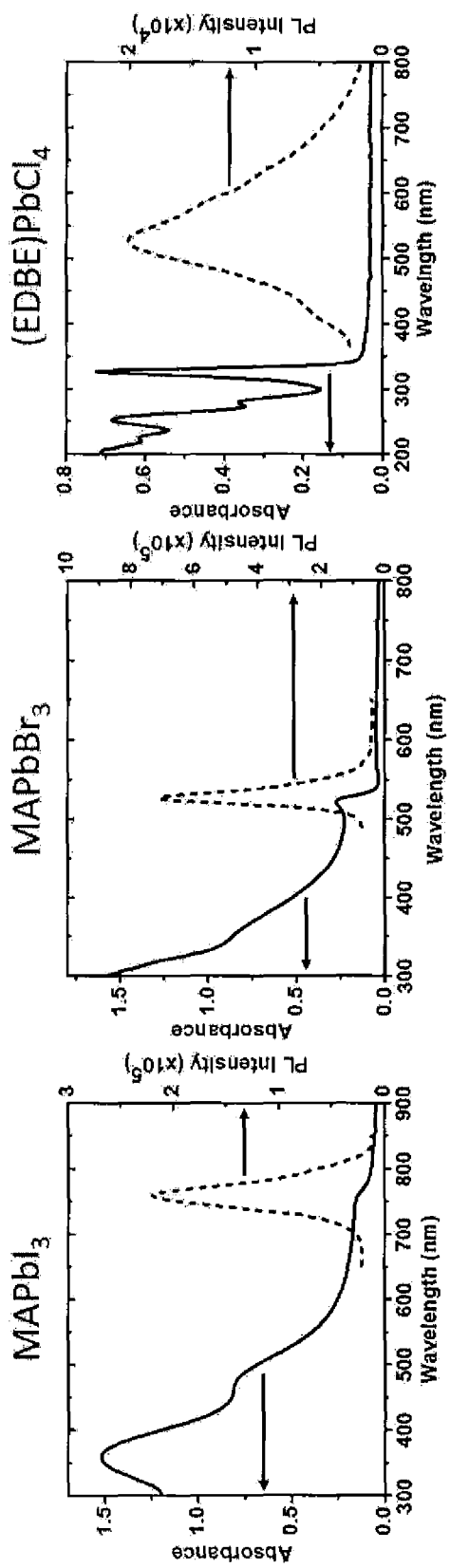
FIGS. 5A, 5B, and 5C show room temperature absorption (solid lines) and photoluminescence spectrum (dotted-lines) of a) $MAPbI_3$, b) $MAPbBr_3$, and c) $(EDBE)PbCl_4$.

FIG. 5 shows room temperature absorption (solid lines) and photoluminescence spectra (dotted-lines) of a) MAPbI$_3$, b) MAPbBr$_3$, and c) (EDBE)PbCl$_4$ for use in an embodiment of the present invention. The absorption and photoluminescence measurements were performed in order to obtain energy band gaps in these perovskites and to confirm the large polaronic Stokes' shift in two-dimensional perovskite (EDBE)PbCl$_4$. In an experiment, the absorption spectra were recorded by an UV-VIS-NIR spectrophotometer using a scanning resolution of 0.5 nm. Steady-state photoluminescence spectra were recorded by a Fluorolog-3 spectrofluorometer with a wavelength resolution 0.5 nm.

As shown in FIG. 5, the photoluminescence peak of MAPbI$_3$ at 760 nm is blue-shifted compared to that of MAPbBr$_3$ at 527 nm, following the corresponding blue-shift of the absorption edges. The absorption spectrum of (EDBE)PbCl$_4$ in FIG. 5 shows a pronounced excitonic peak at 326 nm and a broadband, highly Stokes-shifted (by about 200 nm) photoluminescence peak at 525 nm. Using the results in FIG. 5, the absorption and photoluminescence properties of the corresponding thin films of MAPbI$_3$, MAPbBr$_3$, and (EDBE)PbCl$_4$ may be extracted, which show optical energy gaps of $E_g$=1.51, 2.18, and 3.45 eV for MAPbI$_3$ (see e.g. reference 22), MAPbBr$_3$ and (EDBE)PbCl$_4$ (see e.g. reference 24) respectively. It may be concluded that the optical energy gap values agree well with the appearances and ultraviolet lamp excitation glows of MAPbI$_3$, MAPbBr$_3$, and (EDBE)PbCl$_4$ crystals as discussed in relation to FIG. 1.

Since the light yield of X-ray scintillation is inversely proportional to the optical bandgap E$_g$ (see e.g. references 2 and 18), low-bandgap perovskites such as MAPbI$_3$, MAPbBr$_3$ and (EDBE)PbCl$_4$ (see e.g. FIG. 5) are expected to yield up to about 270,000, 190,000, and 120,000 photons/MeV respectively. These light yields are much higher than state-of-the-art cerium (Ce$^{3+}$) doped lanthanum tribromides LaBr$_3$ (E$_g$=5.90 eV) (see e.g. references 25 and 26) and Ce$^{3+}$ doped lutetium iodides LuI$_3$ (E$_g$=4.15 eV) (see e.g. references 27 and 28) scintillators, with light yields of 68,000 and 100,000 photons/MeV, respectively. As such, perovskite crystals have huge potential for X-ray scintillation.

In addition, FIG. 5 indicates that the two-dimensional perovskite (EDBE)PbCl$_4$ has an unusually large Stokes' shift of about 200 nm compared to the three-dimensional perovskites MAPbI$_3$ and MAPbBr$_3$ (with an excitonic emission Stokes' shifted by <5 nm). In embodiments of the invention, the two-dimensional perovskite may have a polaronic emission Stokes' shifted by at least 50 nm; at least 100 nm; at least 200 nm or at least 300 nm. This is believed to be particularly beneficial to increasing scintillation yield (see e.g. reference 29) since a large Stokes' shift will substantially reduce self-absorption of the luminescence in the material (see e.g. reference 30). In addition, the photoluminescence peaks for MAPbI$_3$ and MAPbBr$_3$ are both narrowband (with FWHM of <50 nm) unlike the polaronic broadband photoluminescence peak of (EDBE)PbCl$_4$ (with FWHM of approximately 150nm).

Figure 6:
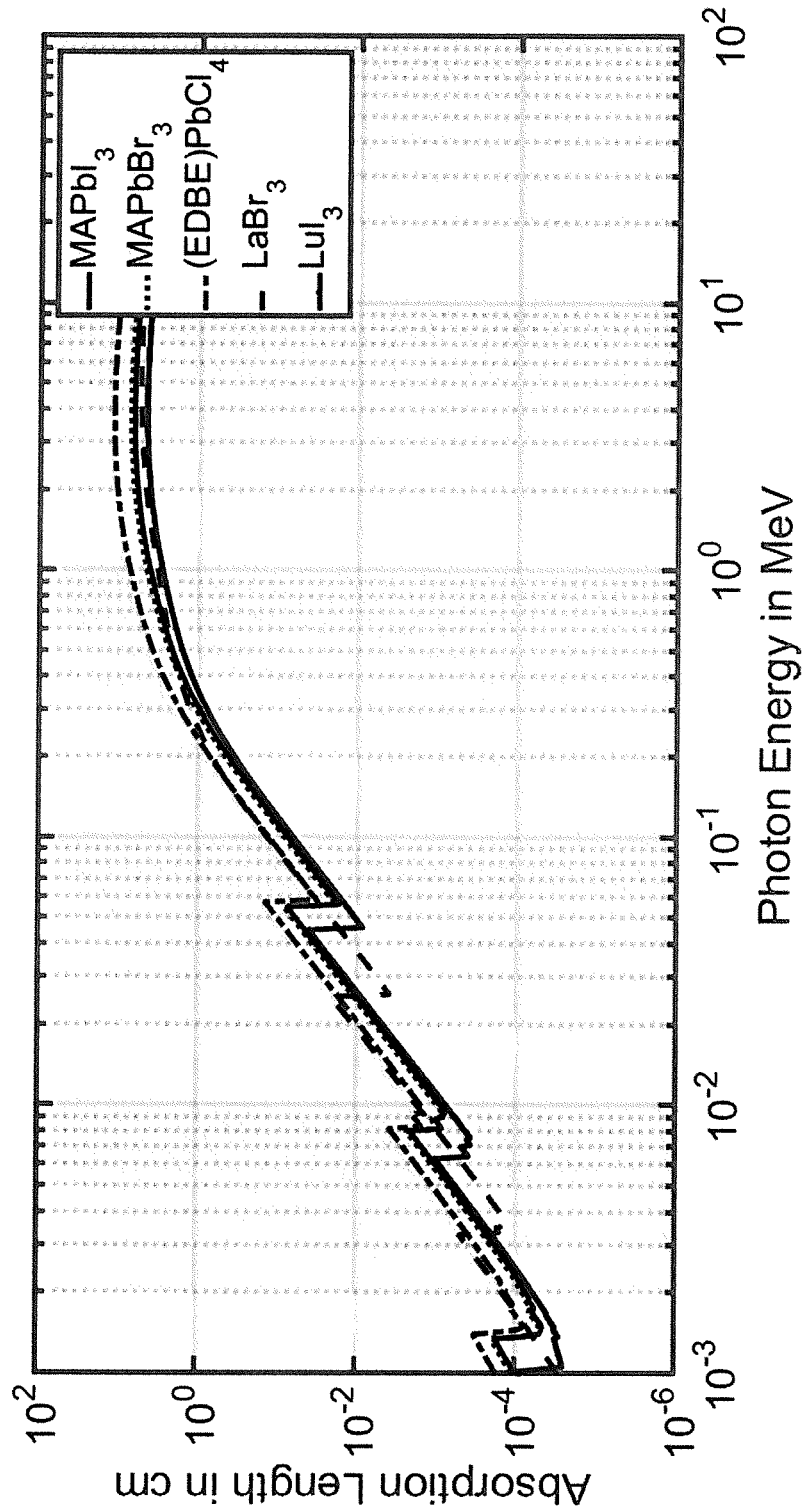
FIG. 6 shows calculated absorption length of $MAPbX_3$ (X=I, Br) three-dimensional perovskites and $(EDBE)PbCl_4$ two-dimensional perovskite crystals as a function of photon energy. Curves for $Ce^{3+}$ doped $LuI_3$ and $LaBr_3$ scintillators from the prior art are also added in FIG. 6 for comparison.

FIG. 6 shows calculated absorption length of MAPbX$_3$ (X=I, Br) three-dimensional perovskites and (EDBE)PbCl$_4$ two-dimensional perovskite crystals as a function of photon energy. The range of photon energies shown covers the X-ray spectral region. Curves for Ce$^{3+}$ doped LuI$_3$ (see e.g. reference 28) and LaBr$_3$ (see e.g. reference 25) scintillators are also shown in FIG. 6 for comparison. The absorption length was obtained from equation (1) below (see e.g. reference 28):

$$l_{abs} \approx \frac{2Z_{eff}}{N_A} \frac{1}{\rho \sigma} \qquad (1)$$

where $Z_{eff}$, $N_A$, $\rho$, and $\sigma$ are the effective atomic number, Avogadro number, the mass density, and the absorption cross-section for each atomic element respectively. Generally, three types of interaction mechanisms for electromagnetic radiation in matter play an important role in the absorption of X-rays and γ-rays. These are photoelectric absorption, Compton scattering, and pair production. All these processes lead to the partial or complete absorption of the radiation quantum. As such, the absorption cross-section was separately characterized for photoelectric absorption, Compton scattering, and pair production, and the total absorption length was determined by the inverse sum of the absorption lengths for these three interaction mechanisms to produce the data as shown in FIG. 6.

Accordingly, since X-ray absorption length scales with the effective atomic number $Z_{eff}$ and mass density p (see e.g. reference 2), MAPbI$_3$, MAPbBr$_3$, and (EDBE)PbCl$_4$ ($Z_{eff}$=66.83, 67.13, and 67.52, ρ=3.947, 3.582, and 2.191 gr/cm$^3$, respectively) should reach X-ray absorption lengths up to 1 cm at 1 MeV, similar to state-of-the-art commercially available Ce$^{3+}$-doped LaBr$_3$ and LuI$_3$ scintillators. This is observed in the calculated absorption length in FIG. 6. Moreover, it is noted that for electro-magnetic wave detection, single crystal structures typically give better X-ray and γ-ray absorption (i.e. comparatively shorter absorption lengths) in comparison with thin film.

Figure 7:
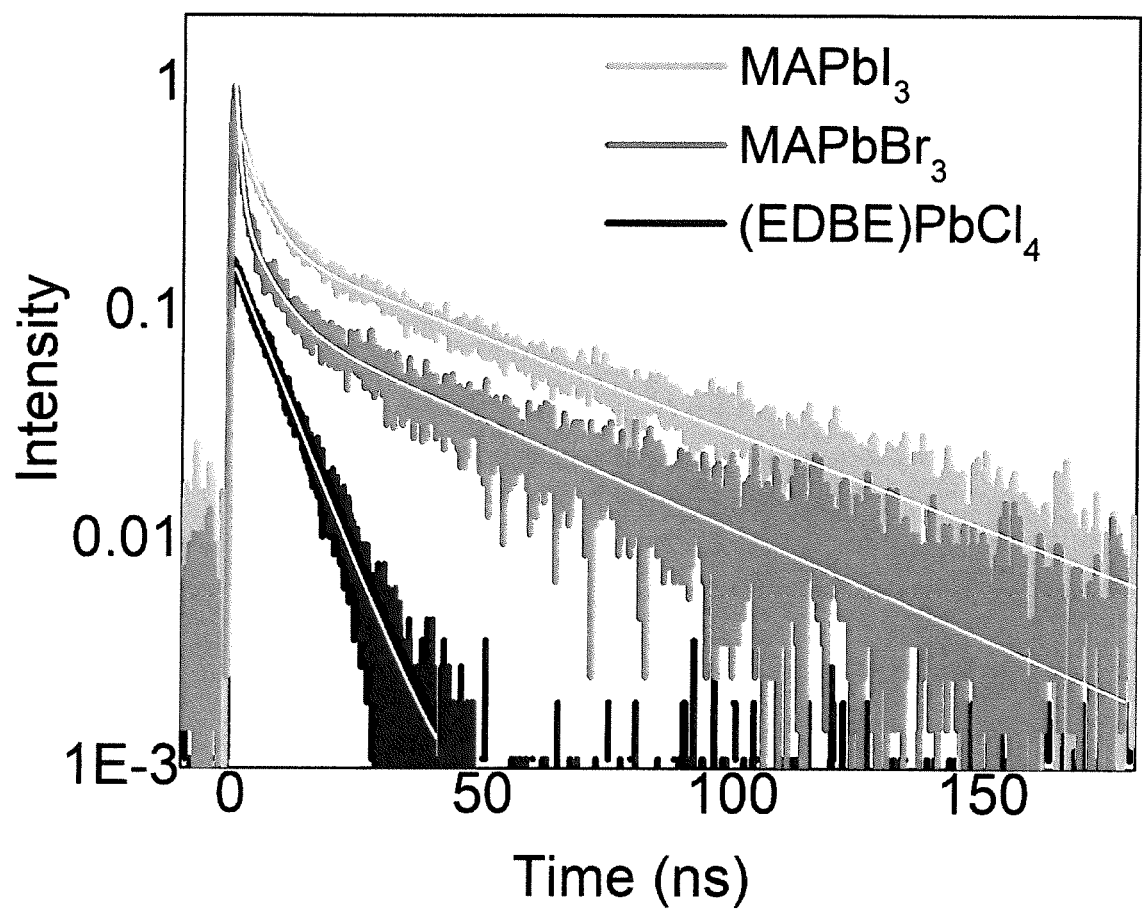
FIG. 7 shows time resolved photoluminescence curves of $MAPbI_3$, $MAPbBr_3$ and $(EDBE)PbCl_4$ single crystals.

FIG. 7 shows time resolved photoluminescence curves of MAPbI$_3$, MAPbBr$_3$ and (EDBE)PbCl$_4$ single crystals. In an experiment, the data for the time resolved photoluminescence curves were obtained from a micro-photoluminescence setup based on the free space excitation technique with excitation path and emission collection at the side using a VIS-NIR microscope objective (40x, NA=0.65). In the setup, MAPbI$_3$ and MAPbBr$_3$ single crystals were excited with 5-MHz-repetition-rate picosecond-pulse light sources using laser diodes with wavelengths of 640 and 370 nm respectively, while the (EDBE)PbCl$_4$ single crystal was excited with a 5-MHz-repetition-rate picosecond-pulse light source using a light-emitting diode at a wavelength of 330 nm. A beam spot size of about 2 mm was used in obtaining all the data as shown in FIG. 7. In addition, a silicon-based charge-coupled-device camera was used for imaging. Time-resolved decay curves in FIG. 7 were obtained using grating devices or tunable bandpass filters at 766, 540, and 520 nm for MAPbI$_3$, MAPbBr$_3$ and (EDBE)PbCl$_4$ crystals respectively, with signals acquired from a photomultiplier or Micro Photon Devices single-photon avalanche photodiode using a time-correlated single photon counting card.

All intensities shown in FIG. 7 were normalized, with the intensity of the plot for (EDBE)PbCl$_4$ being further divided by a factor of five for clarity. The white lines overlaying the curves shown in FIG. 7 correspond to exponential fittings of the data. The decay curves of MAPbI$_3$, MAPbBr$_3$ and (EDBE)PbCl$_4$ were fitted with a double, a triple, and a single exponential fit respectively. Accordingly, the resulting decay components extracted from the exponential fits for MAPbI$_3$ are 4.3 ns and 52.2 ns, with contributions of 18 and 82% respectively, while those of MAPbBr$_3$ are 0.8 ns, 5.2 ns, and 45.4 ns with contributions of 10, 18 and 72% respectively. It is noted that the longer decay times are consistent with the values previously reported for these three-dimensional perovskites (see e.g. reference 23). Moreover, the instrumental resolution (0.05 ns) afforded by the set-up allowed the presence of fast components with decay times <1 ns to be resolved. Nonetheless, due to the limited time window for the measurements, ultra-long-lived components (>300 ns) were not detected. Extraction of decay components for the measurements of (EDBE)PbCl$_4$ provide a single decay component of 7.9 ns, consistent with the photoluminescence lifetime reported for similar two-dimensional perovskites (see e.g. reference 24). Notably, the intensity of (EDBE)PbCl$_4$ reduces much faster than MAPbI$_3$ and MAPbBr$_3$.

The extremely fast photoluminescence decay of MAPbI$_3$, MAPbBr$_3$, and (EDBE)PbCl$_4$ (i.e. fast decay components of 4.3 ns, 0.8-5.2 ns, and 7.9 ns, respectively) enable MAPbI$_3$, MAPbBr$_3$, and (EDBE)PbCl$_4$ to provide faster scintillation than Ce$^{3+}$-doped LaBr$_3$ (with a decay component of 15 ns) (see e.g. references 25 and 30) and Ce$^{3+}$-doped LuI$_3$ (with a decay component of 33 ns) (see e.g. reference 28), given that all the fast components of MAPbI$_3$, MAPbBr$_3$, and (EDBE)PbCl$_4$ are below 10 ns which are much faster than those of commercial scintillators based on Ce$^{3+}$ doped LuI$_3$ and LaBr$_3$. The fast nanosecond scintillation decay times were also demonstrated in PhE-PbBr$_4$ using X-ray and γ-ray pulses (see e.g. references 20 and 31), consistent with the results obtained from the time-resolved photoluminescence spectra as shown in FIG. 7.

FIGS. 8 to 11 show further comparisons between three-dimensional perovskites MAPbI$_3$, MAPbBr$_3$, and two-dimensional perovskite (EDBE)PbCl$_4$ based on data obtained from their X-ray excited luminescence and thermoluminescence spectra. The measurements for the X-ray excited luminescence and thermoluminescence data as shown in FIGS. 8 to 11 were carried out using the set-up as follows. The main setup consists of an Inel XRG3500 X-ray generator (Cu-anode tube, 45 kV/10 mA), an Acton Research Corporation SpectraPro-500i monochromator, a Hamamatsu R928 PMT, and an APD Cryogenics Inc. closed-cycle helium cooler. The emission spectra were corrected for the transmittance of the monochromator and the quantum efficiency of the PMT. First, X-ray excited luminescence was recorded at various temperatures between 10 and 350 K. The measurements were carried out from 350 K to 10 K to minimise possible contributions from thermal release of charge carriers to the emission yield. After X-ray excited luminescence measurements were carried out, low temperature thermoluminescence and glow curves were measured. Prior to the thermoluminescence measurements, the samples were exposed to X-rays for 10 minutes at 10 K. Thermoluminescence and glow curves were recorded between 10 K and 350 K at a heating rate of about 0.14 K/s. Thermoluminescence curves were recorded with the monochromator set to the zeroth order. Photoluminescence spectra were recorded with a commercial spectrofluorometer HORIBA Jobin Yvon Fluorolog-3 spectrofluorometer at room temperature.

Figures 8A, 8B, 8C:
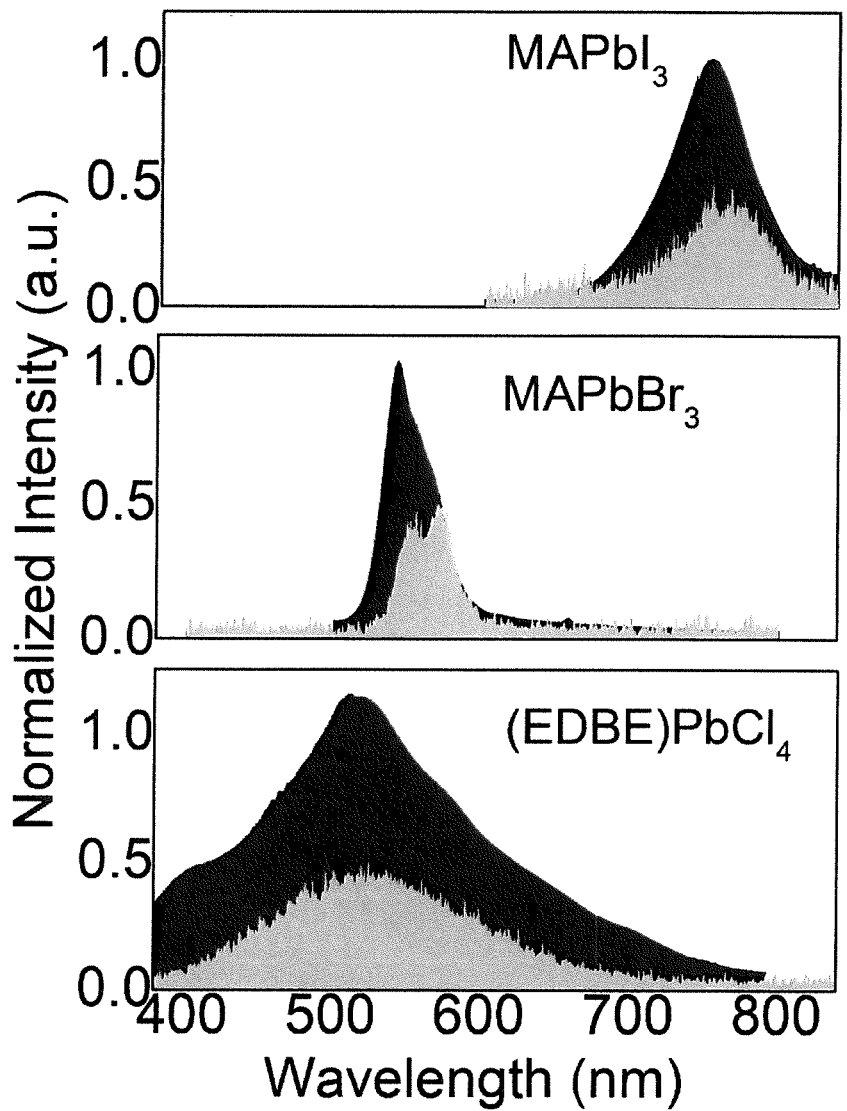
FIGS. 8A, 8B, and 8C show X-ray excited luminescence (light color area) and photoluminescence (dark color area) spectra of a) $MAPbI_3$, b) $MAPbBr_3$, and c) $(EDBE)PbCl_4$ recorded at room temperature.
Figure 11B:
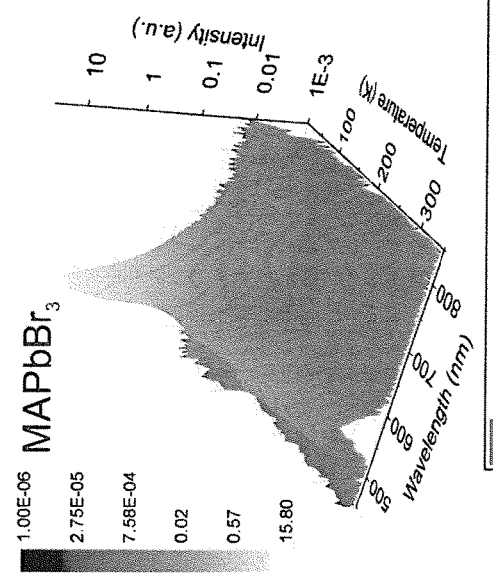
FIGS. 11A, 11B, 11C, and 11D show X-ray excited luminescence spectra of perovskite crystals at various temperatures, from 10 to 350 K: (a) $MAPbI_3$, (b) $MAPbBr_3$, and (c) $(EDBE)PbCl_4$. Part (d) of FIG. 11 shows a comparison of the normalized X-ray excited luminescence spectra of (a), (b) and (c) at T=10 K.
Figure 11D:
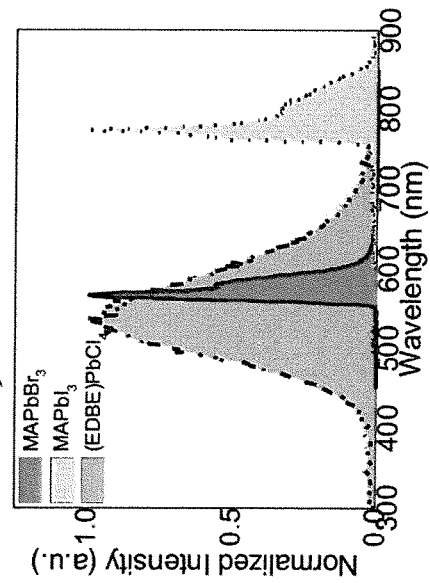
Figure 11A:
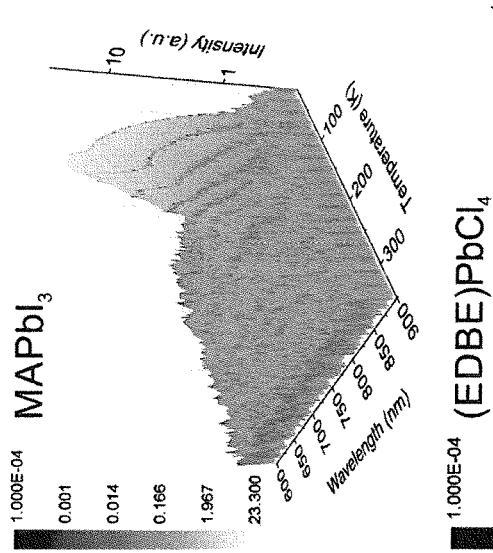
Figure 11C:
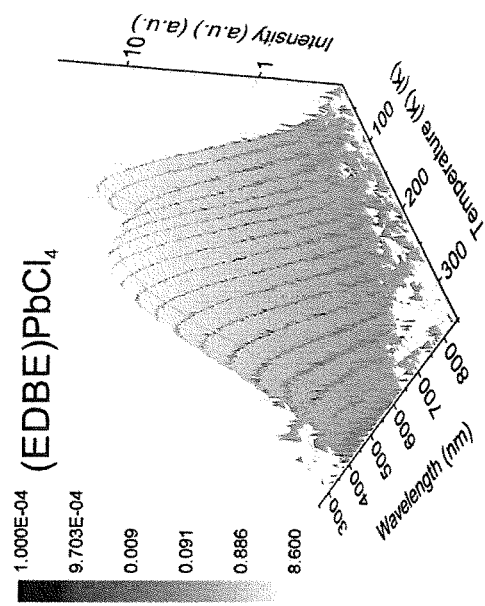

FIG. 8 shows X-ray excited luminescence (light color area) and photoluminescence (dark color area) spectra of a) MAPbI$_3$, b) MAPbBr$_3$, and c) (EDBE)PbCl$_4$ crystals recorded at room temperature. The photoluminescence of MAPbI$_3$, MAPbBr$_3$, and (EDBE)PbCl$_4$ crystals were measured using excitation wavelengths of 425, 500, and 330 nm respectively. The photoluminescence and X-ray excited luminescence spectra in FIG. 8 were normalized to their maxima, while the normalized X-ray excited luminescence spectra were further divided by a factor of two for clarity. As shown in part (a) of FIG. 8, both X-ray excited luminescence and photoluminescence spectra of MAPbI$_3$ have a single broadband peak centered at 750 nm with a full width of half-maximum (FWHM) of ~80 nm. For MAPbBr$_3$, both X-ray excited luminescence and photoluminescence spectra exhibit double peaks centered around 560 and 550 nm respectively as observed from part (b) of FIG. 8. MAPbBr$_3$ has the narrowest emission band with a FWHM of ~40 nm. On the other hand, (EDBE)PbCl$_4$ has the broadest emission band centered at 520 nm, with a FWHM of ~160 nm as seen in part (c) of FIG. 8. Long emission wavelengths in the range of 400 to 700 nm allow optimal detection of scintillation using highly sensitive avalanche photodiodes (APDs), which can reach quantum efficiencies of up to 90-100% in comparison with photomultipliers (PMTs) with an efficiency of only 40-50% (see e.g. reference 28). Accordingly, based on emission wavelengths obtained in FIG. 8, (EDBE)PbCl$_4$ appears to be the most promising candidate for a scintillator coupled to an APD (see e.g. reference 28).

As shown in FIG. 8, all the perovskite crystals measured have very similar X-ray excited luminescence as compared to their photoluminescence spectra. This suggests that the dominant scintillation mechanism may be explained as follows: upon X-ray absorption, high-energy excitations thermalize through ionizations and excitations of atoms, until excitons are generated at energies near the bandgap. As such, X-ray excited luminescence stems solely from the intrinsic excitonic emission of the perovskites and no other defect states seem to be involved in the scintillation process.

The dynamics of radiative processes in materials under high-energy excitation are often complicated by slower non-exponential components due to charge carrier trapping and re-trapping, which manifest themselves as delayed luminescence, or afterglow. Upon termination of the X-ray excitation, afterglow effects would typically contribute a residual luminescence background with characteristic lifetime of a few milliseconds, thus lowering the effective light yield and worsening the signal-to-noise ratio. Afterglow effects are particularly detrimental for applications like computed tomography, in which temporal crosstalk considerably reduces the image quality (see e.g. reference 2). Charge carrier trapping and re-trapping processes can be monitored by thermoluminescence measurements.

FIG. 9 shows low temperature thermoluminescence curves of a) MAPbI$_3$, b) MAPbBr$_3$, and c) (EDBE)PbCl$_4$. The data as shown in FIG. 9 are presented on a time scale starting at a temperature of 10 K, with the temperature being increased after 3600 s to 350 K, as indicated by the dashed line in the right panel (temperature scale on the right axes). As shown in FIG. 9, steady-state X-ray excited luminescence intensity during irradiation was recorded immediately prior to the thermoluminescence scan. As such, two distinct integrated intensities can be evaluated: the first one, denote as $I_{TL}$, comprises the time range from the end of X-ray irradiation till the end of the entire run, while the second one, denoted as $I_{TL}+I_{ssXL}$, comprises the time range from the start of the X-ray irradiation until the end of the run. This allows calculation of the $I_{TL}/(I_{TL}+I_{ssXL})$ ratio for each sample, which can be interpreted as the fraction of the total excitation energy accumulated into traps (see e.g. references 19 and 32). The value of this ratio therefore provides a qualitative estimate of the influence of traps on the scintillation yield.

Referring to FIG. 9, long tails extending to thousands of seconds were observed in all crystals after termination of the X-ray excitation at 10 K. Although the long-lived component of this afterglow effect is much slower than the photoluminescence decay (as compared for example to FIG. 7), it only occurs at low temperatures (~10 K) and is negligible at room temperature. As shown in parts (a) and (b) of FIG. 9, low temperature thermoluminescence curves are dominated by a double-structured peak, with two smaller satellite peaks appearing at longer times for MAPbI$_3$ and MAPbBr$_3$. In contrast, the low-temperature thermoluminescence curve of part (c) of FIG. 9 for (EDBE)PbCl$_4$ shows that one peak strongly dominates the other peak while the total intensity of the peaks is much higher than those in MAPbI$_3$ and MAPbBr$_3$. Based on FIG. 9, the calculated ratio $I_{TL}/(I_{TL}+I_{ssXL})$~0.002 is very similar for both MAPbI$_3$ and MAPbBr$_3$ which is extremely low compared to that of other oxide materials, such as lanthanide aluminium perovskite or garnets, used in scintillators (see e.g. references 19, 32, 33 and 35). Moreover, MAPbI$_3$ and MAPbBr$_3$ crystals show nearly trap-free behavior from T=75 K up to the highest temperature investigated at T=350 K, a very desirable characteristic from the point of view of scintillation speed and efficiency. For (EDBE)PbCl$_4$, the calculated ratio $I_{TL}(I_{TL}+I_{ssXL})$ is approximately 0.058, which is slightly higher than that of three-dimensional perovskite crystals MAPbI$_3$ and MAPbBr$_3$. Nevertheless, this value is still relatively low.

FIG. 10 shows glow curves of the three crystals MAPbI$_3$, MAPbBr$_3$ and (EDBE)PbCl$_4$. The glow curves were recorded after 10 minutes of X-ray irradiation at 10 K, and at a heating rate of 0.14 K/s. Appearances of thermoluminescence signals at temperatures below 150 K reveals the existence of low-energy trap states. Since it is difficult to determine the exact number of traps, their depth and frequency factors (see e.g. reference 33) for these low-energy trap states, the analysis was restricted to thermoluminescence peaks with intensity larger than 10% of their maximum. Thermoluminescence curves have been deconvoluted into k glow peaks, based on the classic Randall-Wilkins equation (2) below (see e.g. reference 34):

$$I_{TL} = \sum_{i=1}^{k} n_{0i} V \sigma_i \exp\left(-\frac{E_i}{k_B T}\right) \exp\left(-\frac{\sigma_i}{\beta} \int_{T_0}^{T} \exp\left(-\frac{E_i}{k_B T'}\right) dT'\right) \quad (2)$$

where T is the temperature, β the heating rate, and $k_B$ the Boltzmann constant; $n_{0i}$ is the initial trap concentration, V is the crystal volume, $E_i$ the trap depth, $\sigma_i$ the frequency factor of each component. Note that the unitless number of traps $n_{0i} V$ is often used to compare the afterglow of different crystals (see e.g. references 19, 32, 33, 34 and 35).

The above analysis provides a good indication of the characteristics of prevailing trap states, though it cannot resolve the existence of traps at times much longer than seconds, or with mixed order kinetics (see e.g. reference 32). The room temperature lifetime $\tau_i$ of trapped carriers, such as electron or hole centers and excitons, can also be estimated from the energy and frequency factor of the trap, using the well-known Arrhenius formula of equation (3):

$$\frac{1}{\tau_i} = \sigma_i \exp\left(-\frac{E_i}{k_B T}\right) \quad (3)$$

The solid lines as shown in FIG. 10 represent best-fitted curves to the experimental data points using the above Equation (2). Single components of the best fits and its peak temperature are indicated by dashed lines and arrows respectively. The glow curves of MAPbI$_3$ and MAPbBr$_3$ have been fitted using four and three components respectively, while the glow curve of (EDBE)PbCL$_4$ can be fitted with only two components. The corresoondina fittina parameters are shown in Table 1 below.

TABLE 1

Trap state parameters. The parameters were derived from the fitting of first-order glow curves in FIG. 10: $T_{max}$ is the temperature at which the glow curve peaks, E the trap depth, ln σ the logarithmic frequency factor in s$^{-1}$, τ the room temperature lifetime, and $n_0V$ the total, initial number of traps. Comparative parameters of known scintillator materials from the literature are also reported in the last three rows.

| Compound | $T_{max}$ (K) | E (eV) | ln σ (s$^{-1}$) | τ (s) | $n_0V$ | Reference |
|---|---|---|---|---|---|---|
| MAPbI$_3$ | 32 | 0.0309 | 8.09 | $1.04 \cdot 10^{-3}$ | $2.45 \cdot 10^4$ | This work |
| | 46 | 0.0226 | 1.78 | 0.41 | $1.85 \cdot 10^4$ | |
| | 56 | 0.0901 | 15.60 | $5.95 \cdot 10^{-4}$ | $6.12 \cdot 10^3$ | |
| | 62 | 0.0389 | 3.25 | 0.18 | $1.45 \cdot 10^4$ | |
| MAPbBr$_3$ | 33 | 0.0139 | 1.16 | 0.54 | $7.61 \cdot 10^4$ | This work |
| | 56 | 0.0602 | 9.02 | $1.31 \cdot 10^{-3}$ | $2.10 \cdot 10^4$ | |
| | 68 | 0.0909 | 12.1 | $2.04 \cdot 10^{-4}$ | $2.73 \cdot 10^4$ | |
| EDBEPbCl$_4$ | 32 | 0.0177 | 2.83 | 0.12 | $5.95 \cdot 10^5$ | This work |
| | 45 | 0.0281 | 3.40 | 0.10 | $1.71 \cdot 10^6$ | |
| LuAlO$_3$:Ce$^{3+}$ | 36 | 0.0148 | 0.9346 | $2.16 \cdot 10^{-2}$ | $2.84 \cdot 10^4$ | 19, 32, 35 |
| | 88 | 0.105 | 10.07 | $2.29 \cdot 10^{-2}$ | $1.53 \cdot 10^4$ | |
| | 187 | 0.498 | 27.22 | $2.51 \cdot 10^{-2}$ | $2.10 \cdot 10^6$ | |
| | 206 | 0.385 | 17.56 | $1.61 \cdot 10^{-2}$ | $4.64 \cdot 10^4$ | |
| | 223 | 0.669 | 30.99 | $2.18 \cdot 10^{-2}$ | $1.38 \cdot 10^4$ | |
| | 253 | 0.75 | 30.53 | $2.08 \cdot 10^{-2}$ | $4.84 \cdot 10^4$ | |
| | 273 | 0.799 | 30.08 | $2.05 \cdot 10^{-2}$ | $1.52 \cdot 10^5$ | |
| YAlO$_3$:Ce$^{3+}$ | 108 | 0.30 | 29.24 | $4.99 \cdot 10^{-2}$ | ~$10^5$ | 19, 32, 35 |
| | 154 | 0.50 | 34.18 | $3.02 \cdot 10^{-2}$ | ~$10^5$ | |
| | 281 | 0.421 | 18.05 | 1.95 | ~$10^4$ | |
| Gd$_3$Al$_2$Ga3O$_{12}$:Ce$^3$ | 36 | 0.0576 | 15.9 | $1.2 \cdot 10^{-6}$ | $1.6 \cdot 10^5$ | 33 |
| | 45 | 0.0446 | 8.32 | $1.4 \cdot 10^{-3}$ | $4.7 \cdot 10^5$ | |
| | 73 | 0.116 | 15.1 | $2.7 \cdot 10^{-5}$ | $3.4 \cdot 10^5$ | |
| | 181 | 0.211 | 9.01 | 0.52 | $2.9 \cdot 10^5$ | |
| | 240 | 0.527 | 21.31 | 0.65 | $2 \cdot 10^5$ | |
| | 255 | 0.321 | 9.76 | 19 | $7.5 \cdot 10^5$ | |

Accordingly, from the extraction of various parameters as shown in Table 1, it can be shown that all three crystals MAPbI$_3$, MAPbBr$_3$ and (EDBE)PbCl$_4$ have relatively low trap densities, with traps having depth energies (E) ranging from ~10 to 90 meV. The initial trap concentrations $n_0$ in MAPbI$_3$ and MAPbBr$_3$ can be calculated from the total number of traps ($n_0 V \sim 10^3$-$10^4$) and the volume of the crystal (V~30-100 mm$^3$). The resulting trap concentrations ($n_0 \sim 10^5$-$10^7$ cm$^{-3}$) are comparable to those of shallow traps previously observed in photoconductivity measurements (~$10^5$-$10^7$ cm$^{-3}$) (see e.g. reference 11) and space-charge-limited-current (~$10^9$-$10^{10}$ cm$^{-3}$) (see e.g. reference 23), taking into account uncertainties in the estimate of the active crystal volume. The fastest room temperature lifetimes (τ) of MAPbI$_3$ and MAPbBr$_3$ are of the order of milliseconds, long enough to contribute to the light yield components without residual luminescence background. Correspondingly, logarithmic frequency factors (ln σ) are all below 16, which is much smaller than ln σ~30 typically found in pristine or activated oxide materials (see e.g. references 19, 32, 33 and 35, and Table 1 for comparison).

In essence, the halide perovskite scintillators investigated as shown in FIG. 10 together with Table 1 indicate an absence of deep traps and a very small density of shallow trap states. There were also no after-glow effects even at room temperature (RT). For scintillators, these properties are excellent for the X-ray or γ-ray imaging. The crosstalk of photons disturbing imaging quality will also be absent.

Particularly, it is noted from Table 1 that two-dimensional (EDBE)PbCl$_4$ has the largest trap density of $n_0 \sim 10^7$ cm$^{-3}$ among the three perovskites. Large concentration of shallow traps may be beneficial for X-ray scintillation at low-temperature, as seen in the case of Ce$^{3+}$-doped YAlO$_3$ and LuAlO$_3$ (see e.g. reference 35), or pristine Li$_2$B$_4$O$_7$ (see e.g. reference 36). This is observed in temperature dependent X-ray excited luminescence spectral maps as shown in FIG. 11 below.

FIG. 11 shows X-ray excited luminescence spectra of (a) MAPbI$_3$, (b) MAPbBr$_3$, and (c) (EDBE)PbCl$_4$ perovskite crystals at various temperatures, from 10 K to 350 K. Part (d) of FIG. 11 shows a comparison of the normalized X-ray excited luminescence spectra of (a), (b) and (c) of FIG. 11 at T=10 K. Accordingly, the X-ray excited luminescence spectra of MAPbI$_3$ and MAPbBr$_3$ show strong dependence of X-ray excited luminescence on temperature, with significantly reduced emission at temperatures above 100 K. For example, a rather weak emission between 520 nm and 600 nm having a double structure was observed for MAPbBr$_3$ at 300 K and above. Its intensity significantly increases when the temperature decreases and it reaches a maximum at 10 K. Similar to MAPbBr$_3$, there is no strong emission above 100 K for MAPbI$_3$ (see e.g. part (a) of FIG. 11). However, at very low temperatures, the X-ray excited luminescence spectra of MAPbI$_3$ and MAPbBr$_3$ display distinct emission bands with sharp maxima at 770 nm and 570 nm respectively (see e.g. part (d) of FIG. 11 for comparison of X-ray excited luminescence spectra recorded at T=10 K). Notably, the X-ray excited luminescence peak at 770 nm, with a FWHM of 5 nm, has the same characteristics as coherent light emission previously observed in MAPbI$_3$ (see e.g. reference 17). Side bands are also observed at 760 and 800 nm in MAPbI$_3$ and at ~590 nm in MAPbBr$_3$ but their origins are unclear. On the other hand, the X-ray excited luminescence spectrum of two-dimensional perovskite (EDBE) PbCl$_4$ (see part (c) of FIG. 11) consists of a much broader band peaking at ~520 nm, with intensity significantly less sensitive to temperature. As temperature increases, the X-ray excited luminescence intensity first decreases between 10 K and 50 K, then increases towards 130 K, and reduces steadily at higher temperatures. In all the three crystals of MAPbI$_3$ and MAPbBr$_3$ and (EDBE)PbCl$_4$, the FWHM of X-ray excited luminescence peaks increases with increasing temperature, consistent with the spreading of excited electrons to high vibrational levels (see e.g. reference 37). As such, two-dimensional perovskite single crystals, such as (EDBE)PbCl$_4$, are more stable against temperature quenching than three-dimensional ones as observed for MAPbI$_3$ and MAPbBr$_3$. This leads to a better light yield for two-dimensional perovskite single crystals, such as (EDBE) PbCl$_4$, as compared to three-dimensional ones e.g. MAPbI$_3$ and MAPbBr$_3$.

Figure 12:
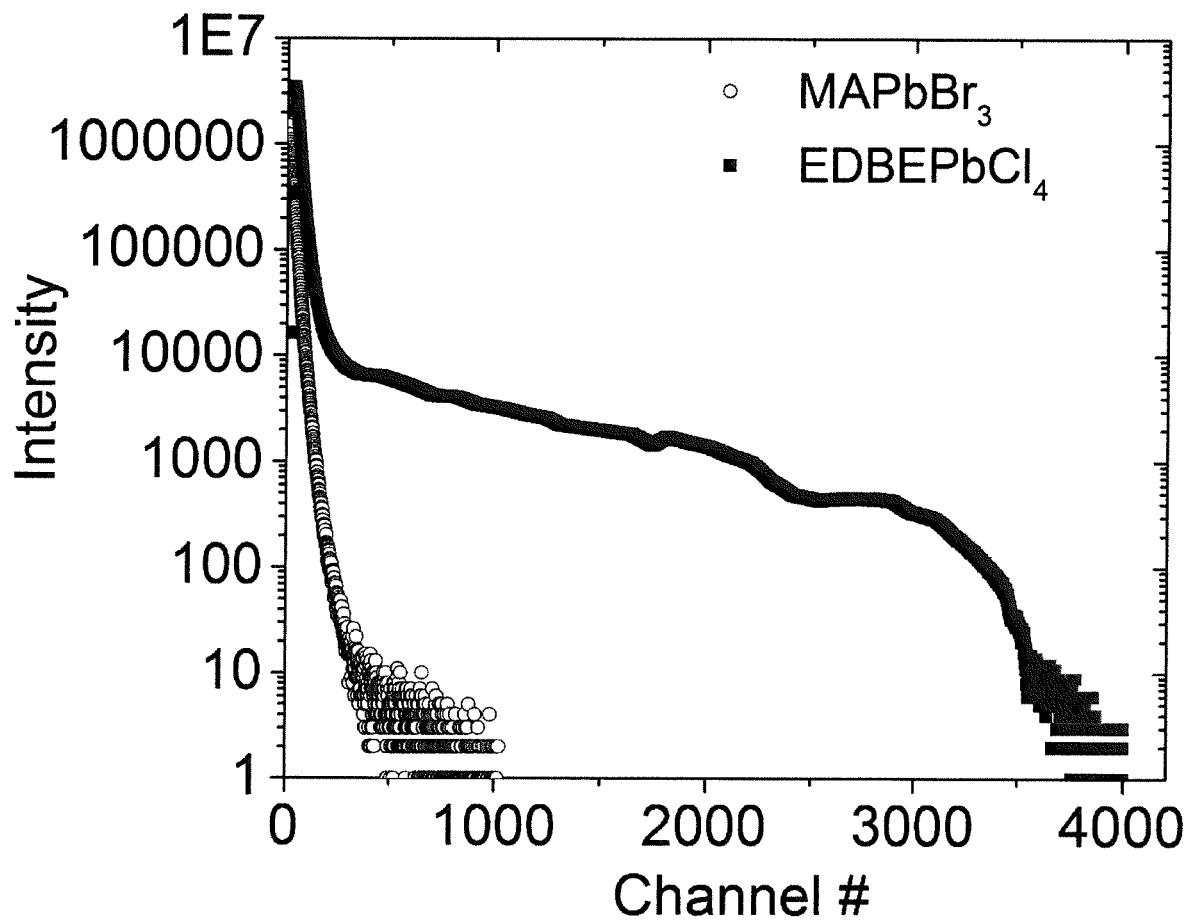
FIG. 12 shows pulse height spectra of perovskite crystals under 662 keV of $^{137}Cs$ source with a pulse shaping time of 2 μs.

FIG. 12 shows pulse height spectra of perovskite crystals MAPbBr$_3$ and (EDBE)PbCl$_4$. Pulse height spectra were measured at room temperature under 662 keV gamma excitation from a $^{137}$Cs source (no. 30/2010, 210 kBq) with a pulse shaping time of 2 μs. The pulsed output signal from a Hamamatsu R2059 photomultiplier was processed by a Canberra 2005 integrating preamplifier, a Canberra 2022 spectroscopy amplifier, and a multichannel analyzer. To improve the light collection efficiency, the samples were coupled to a quartz window of the photomultiplier with Viscasil grease and covered with several layers of Teflon tape. Light yields were obtained from the position of the 662 keV photopeak in pulse height spectra both recorded with the photomultiplier and the APD. Using the photomultiplier, the photoeletron yield, expressed in photoelectrons per MeV of absorbed γ-ray energy (phe/MeV), was determined by comparing the peak position of the 662 keV photopeak to the position of the mean value of the single electron response (see e.g. reference 28).

As discussed previously, light yields of perovskite single crystals estimated from their bandgaps should be >120,000 photons/MeV. Accordingly, based on the pulse height measurements as shown in FIG. 12, the actual light yield measured for (EDBE)PbCl$_4$ at 300 K (i.e. at room temperature) is about 9,000 photons/MeV. There is currently a limited number of reports on energy spectra from y-ray for perovskite scintillators (see e.g. reference 10) and direct conversion detectors (see e.g. reference 12). Nonetheless, it is noted that the light yield of (EDBE)PbCl$_4$ derived from FIG. 12 is similar to that of two-dimensional perovskite crystal PhE-PbBr$_4$ (10,000 photons/MeV) reported previously (see e.g. reference 31). On the other hand, the light yields of MAPbBr$_3$ and MAPbI$_3$ at room temperature are much lower (at less than 1,000 photons/MeV) and cannot be extracted accurately from pulse height experiments. It is noted that the low light yields observed at room temperature for three-dimensional perovskites may arise from thermally activated quenching effects not present in two-dimensional perovskites.

Figure 13:
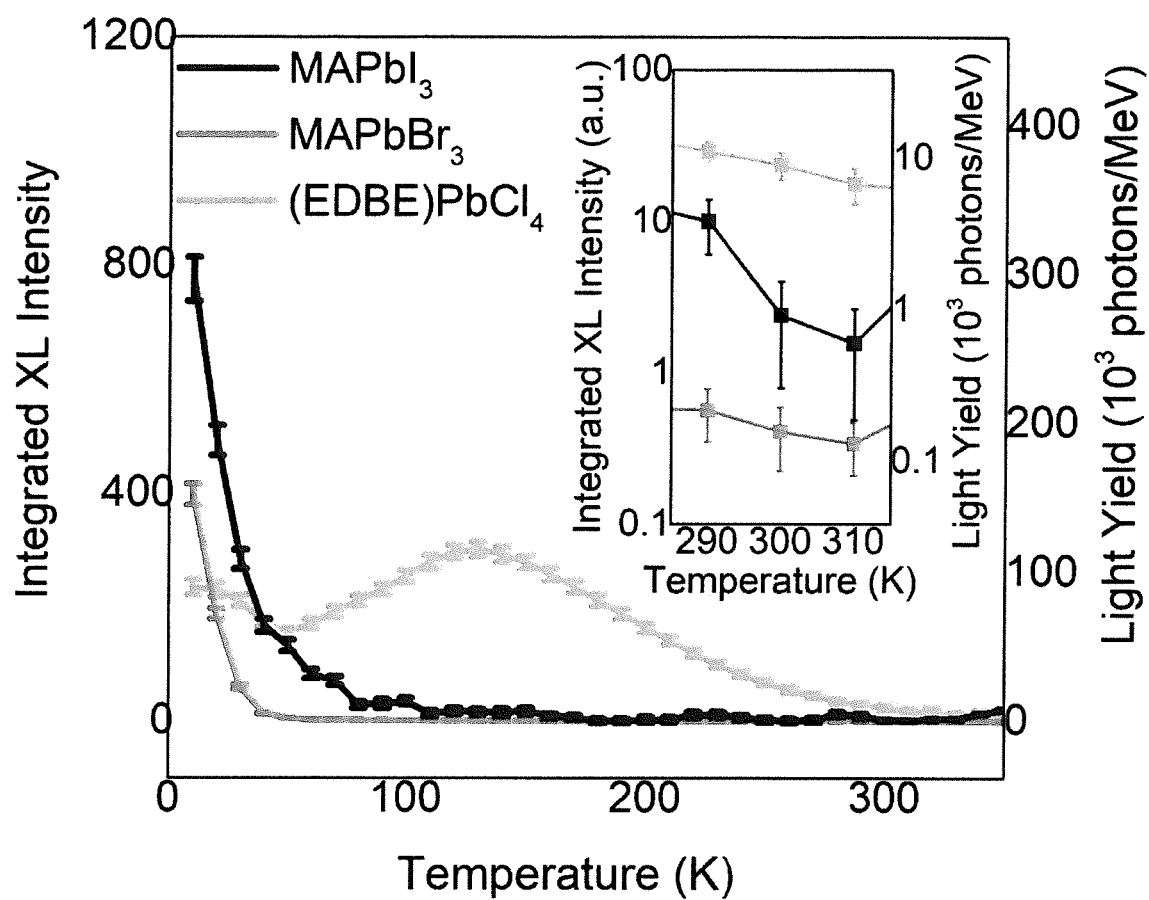
FIG. 13 shows light yields of $MAPbI_3$, $MAPbBr_3$, and $(EDBE)PbCl_4$ obtained from the integrated X-ray excited luminescence intensities at various temperatures, from 10-350 K. The inset of FIG. 13 shows details of the curves from 290 to 310 K.

FIG. 13 shows light yields of MAPbI$_3$, MAPbBr$_3$, and (EDBE)PbCl$_4$ obtained from the integrated X-ray excited luminescence intensities as a function of temperature from 10-350 K. The left axis of FIG. 13 shows integrated intensity in arbitrary units obtained from the corrected X-ray excited luminescence spectra in FIG. 11, while the right axis exhibits the light yield in absolute units after calibration of the light yield of (EDBE)PbCl$_4$ at 300 K to ~9,000 photons/ MeV, as derived independently from its pulse height spectrum. The inset of FIG. 13 shows details of the curves from 290 to 310 K. The light yields at different temperatures were derived from the integrated intensities of the X-ray excited luminescence spectra in FIG. 11. It is noted that since the afterglow is small, the light yield derived from the X-ray excited luminescence spectra is expected to be very similar to that derived from the pulse height spectra.

To obtain the integrated X-ray excited luminescence intensities as a function of temperature from 10-350 K as shown in FIG. 13, the corrected intensity of X-ray excited luminescence spectra in FIG. 11 was integrated and the integrated intensity was calibrated using the light yield of ~9,000 photons/MeV derived from the pulse height spectrum of (EDBE)PbCl$_4$ at 300 K of FIG. 12. Referring to FIG. 13, for (EDBE)PbCl$_4$, the resulting light yield at 300 K is about ~8% of the maximum at 130 K. Since the light yield is linearly proportional to the photoluminescence quantum efficiency (see e.g. reference 18) while the efficiency of charge transport to the recombination center is almost unity (see e.g. reference 24 and 29), the ratio of 8% is consistent with the reported (EDBE)PbCl$_4$ photoluminescence quantum efficiency of less than 10% at room temperature. On the other hand, the light yields of MAPbI$_3$ and MAPbBr$_3$ as shown in FIG. 13 are <1,000 photons/MeV at room temperature (see inset of FIG. 13 which shows details of the curves from 290 K to 310 K), and are 296,000 and 152,000 photons/MeV at 10 K respectively. The maximum light yields of MAPbI$_3$ and MAPbBr$_3$ agree well with the attainable light yields derived from their bandgaps (which are 270,000 and 190,000 photons/MeV respectively). Unlike (EDBE)PbCl$_4$, the ratio between the light yields at 300 K and those at 10 K for MAPbI$_3$ and MAPbBr$_3$ is less than 0.5% which is much smaller than their respective quantum efficiencies of 30% and 10% (see e.g. references 17 and 38). Additional light-yield-loss in MAPbI$_3$ and MAPbBr$_3$ could be due to non-radiative recombination of free electrons and holes within the ionization tracks (see e.g. references 2 and 18).

The larger light yield of (EDBE)PbCl$_4$ at room temperature observed in FIG. 13 can be explained by its extremely large exciton-binding energy of about 360 meV (see e.g. reference 29), which is typical for two-dimensional perovskites and gives rise to a pronounced excitonic absorption below the band-edge (see FIG. 5). In contrast, three-dimensional perovskites are known for their low exciton binding energy. For example, MAPbBr$_3$ and MAPbI$_3$ have exciton binding energies in the range of 2-70 meV (see e.g. references 22 and 23). Generally, loosely bound excitonic states in three-dimensional perovskites are much more prone to thermal quenching than tightly bound excitons in two-dimensional perovskites like (EDBE)PbCl$_4$, resulting in three-dimensional perovskite crystals requiring much lower operating temperatures than two-dimensional crystals to achieve optimal scintillation performance.

Figure 14:
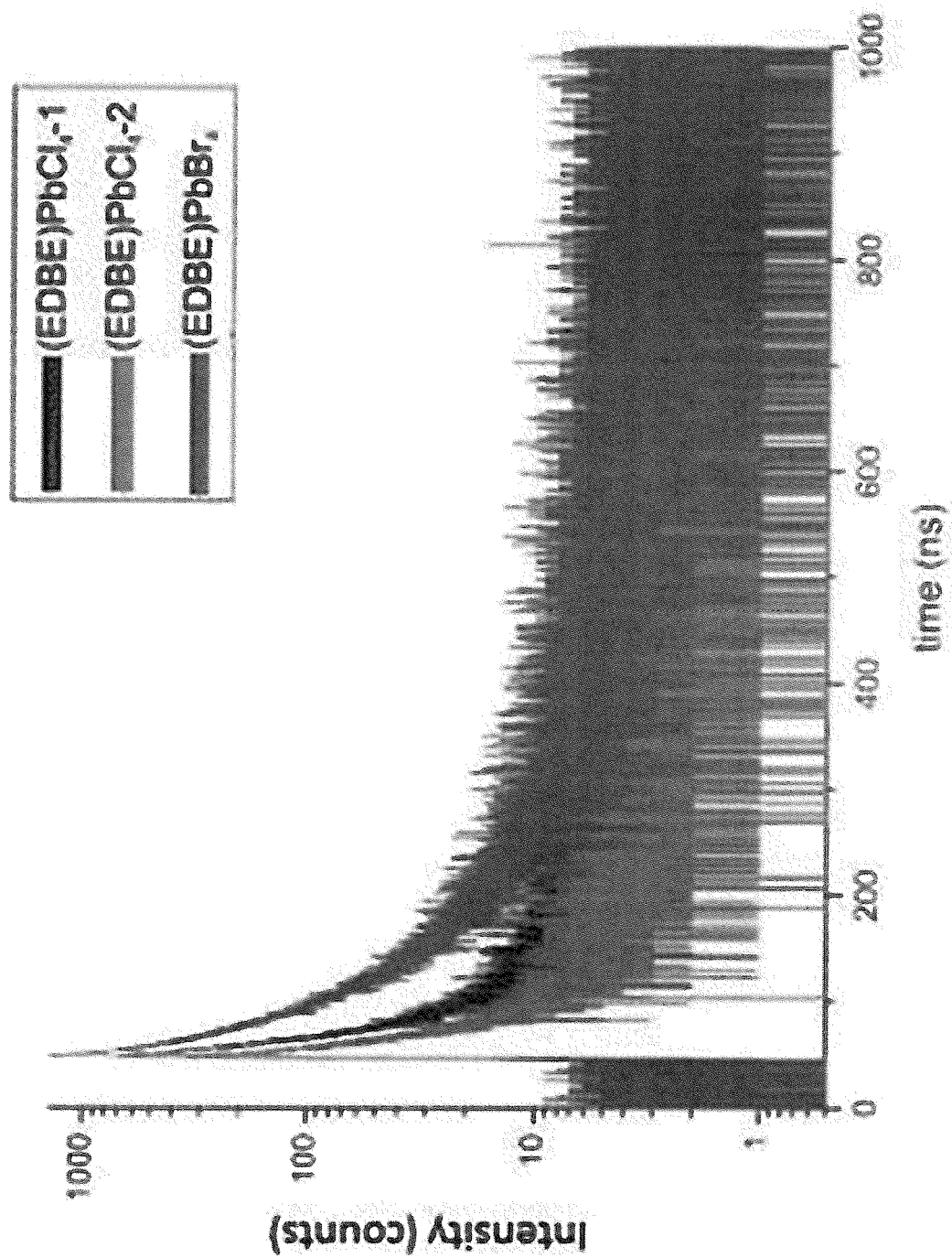
FIG. 14 shows scintillation decay curves at room temperature using picosecond X-ray pulses at 10 mA, 45 kV for samples of $(EDBE)PbCl_4$ and $(EDBE)PbBr_4$.

FIG. 14 shows scintillation decay curves at room temperature under excitation by picosecond X-ray pulses at 10 mA and 45 kV for (EDBE)PbCl$_4$ and (EDBE)PbBr$_4$. The measurements were done with two samples of (EDBE)PbCl$_4$ and a sample of (EDBE)PbBr$_4$ inside a plastic bag to avoid moisture. Referring to FIG. 14, the primary decay observed for (EDBE)PbCl$_4$ and (EDBE)PbBr$_4$ are 8 ns and 16 ns respectively. Note that all the fast components are below 16 ns, much faster than 15 and 23 ns of commercial scintillators based on Ce$^{3+}$ doped LuI$_3$ and LaBr$_3$, respectively. For three-dimensional perovskites, scintillation decay curves were not obtained as these perovskites have extremely low light yield at room temperature.

In summary, the results presented in FIGS. 1 to 14 suggest that two-dimensional hybrid lead halide perovskite single crystals are very promising scintillator materials due to their low fabrication costs, low intrinsic trap densities, nanosecond fast responses, and potentially high light yields. Thermoluminescence measurements have indicated that two-dimensional perovskite crystals have much lower trap density than conventional oxide scintillator materials (see e.g. references 19 and 33). Moreover, low-temperature X-ray excited luminescence measurements show that the X-ray luminescence yield can be as high as ~120,000 photons/MeV in (EDBE)PbCl$_4$ at T=130 K, and in excess of 150,000 photons/MeV in MAPbI$_3$ and MAPbBr$_3$ at T=10 K.

In particular, while light yield of three-dimensional perovskites MAPbI$_3$ and MAPbBr$_3$ is significantly reduced at room temperature (<1,000 photons/MeV), the two-dimensional perovskite (EDBE)PbCl$_4$ is less affected by thermal quenching (9,000 photons/MeV at room temperature) as a result of its large exciton binding energy. This significantly improves operating temperature range for two-dimensional perovskites as compared to three-dimensional perovskites for use as scintillators and photo-detectors. Moreover, the large Stokes' shift (e.g. 50 nm) present in two-dimensional perovskites such as (EDBE)PbCl$_4$ minimises loss due to re-absorption. As such, electro-magnetic wave detectors comprising two-dimensional perovskites with a large Stokes' shift have relatively large light yield and short decay times which are characteristics of high performance electromagnetic wave detectors.

Notably, the wide synthetic versatility of hybrid perovskites allows easy tuning of their scintillation properties. For example, their emission spectra can be controlled by cation or halide substitution to perfectly match the spectral sensitivity of high-quantum-efficiency APD, like in the case of MAPbBr$_3$ and (EDBE)PbCl$_4$. Moreover, their emissive properties can be further enhanced through engineering of perovskite structure and dimensionality. Given the potential of hybrid lead halide perovskite crystals, further efforts could be made to synthesize new materials for X-ray and γ-ray scintillation. For instance, the light yield of perovskite crystals could be further improved by introducing lanthanide ions, e.g. Ce$^{3+}$ ions, as impurities (see e.g. references 18 and 39), or halides can be mixed to modify their bandgaps (see e.g. reference 40). Additionally, the optimal operating temperature for scintillators could also be increased through the design of wide band gap two-dimensional perovskite crystals with minimal quenching effects.

At present, the only reported two-dimensional perovskite scintillator is PhE-PbBr$_4$ (see e.g. reference 31). Typically, two-dimensional perovskites show free-exciton, narrowband emissions (FWHM~20-30 nm) with very small Stokes shifts (~4-5 nm) (e.g. PhE-PbBr$_4$) as a result of direct band-to-band recombination. However, two-dimensional perovskite scintillators made with PhE-PbBr$_4$ have narrowband emissions and small Stokes' shifts of less than 50 nm, thereby yielding a relatively low light yield and a longer decay time with a main decay component at 9.4 ns.

Given the huge potential of two-dimensional perovskites for use as scintillators and/or photo-detectors, other prospective cations or doping are proposed below: Cations:

A. (EDBE) [e.g. 1,2,2'-(ethylenedioxy)bis(ethylammonium)tetra halide plumbate with chemical formula C$_6$H$_{18}$O$_2$N$_2$PbX$_4$ (X=F, Cl, Br, I)];

Advantages: these compounds contain heavier atoms, such as oxygen atoms, which make X-ray detection more efficient (e.g. shorter absorption length).

B. (N-MEDA) [e.g. (N-MEDA) tetra halide plumbate with chemical formula C$_3$N$_2$H$_{12}$PbX$_4$ (X=F, Cl, Br, I)];

Advantages: these compounds contain less carbon and hydrogen atoms which make X-ray detection more efficient.

C. (N-MPDA) [e.g. (N-MPDA) tetra halide plumbate with chemical formula $C_4N_2H_{14}PbX_4$ (X=F, Cl, Br, I)];
  Advantages: these compounds contain less carbon and hydrogen atoms which make X-ray detection more efficient.
D. (AETU) [e.g. 2-(aminoethyl)isothiourea tetra halide plumbate with chemical formula $C_3H_{11}N_3SPbX_4$ (X=F, Cl, Br, I)]
  Advantages: these compounds contain heavier atoms, such as oxygen atoms, which make X-ray detection more efficient (e.g. shorter absorption length).
E. (CEA) [e.g. cyclohexylammonium tetra halide plumbate with chemical formula $C_{12}H_{28}N_2PbX_4$ (X=F, Cl, Br, I)]
F. (ODA) [e.g. octadecylammonium tetra halide plumbate with chemical formula $C_{36}H_{80}N_2PbX_4$ (X=F, Cl, Br,
  Advantages: this cation provides improved moisture stability.
G. (PEA) [e.g phenethylammonium tetra halide plumbate with chemical formula $C_{16}H_{24}N_2PbX_4$ (X=F, Cl, Br, I)].
  Advantages: this cation provides improved moisture stability.
H. (NBT) [e.g n-butylammonium tetra halide plumbate with chemical formula $C_8H_{24}N_2PbX_4$ (X=F, Cl, Br, I)]
I. (API) [e.g. N-(3-Aminopropyl)imidazole) with chemical formula $C_6H_{13}N_3PbX_4$ (X=F, Cl, Br, I)]
Doping:
  Group IVa metal, divalent lanthanides (eg. $Eu^{2+}$, $Yb^{2+}$ and $Dy^{2+}$), $Cd^{2+}$, $Cu^{2+}$, $Fe^{2+}$, $Mn^{2+}$ or $Pd^{2+}$ replacing $Pb^{2+}$, other lanthanides (eg. $Ce^{3+}$, $Pr^{3+}$, and $Nd^{3+}$) and $Tl^+$.

Without limiting to the cations and/or doping above, generally, it is provided that any layered hybrid perovskites of the Ruddlesden-Popper series with general formula $(A)_2(B)_{n-1}[Pb_nX_{3n+1}]$, where A is a bulky cation, B is a small cation and X is an anion may be used in scintillators and/or photodetectors. In an embodiment, it is provided that a layered hybrid perovskite of the Ruddlesden-Popper series also has a large Stokes shift, preferably above 50 nm, such that it minimises loss due to reabsorption and therefore provides an efficient scintillator and/or photodetector. Examples of a small cation (i.e. B) is methylammonium, formamidinium and cesium.

Figures 16A, 16B:
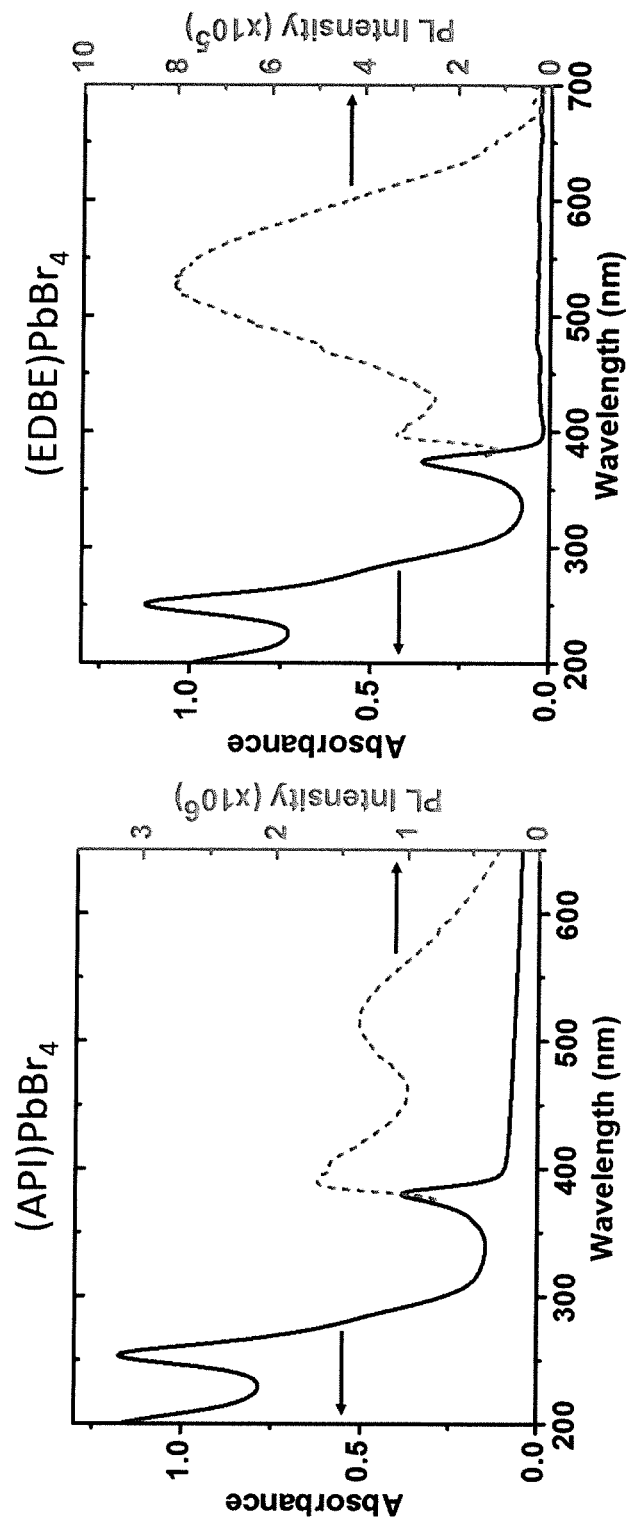
FIGS. 16A and 16B shows steady state absorption and luminescence of broadband emitters using a) $(API)PbBr_4$ and b) $(EDBE)PbBr_4$ respectively.

FIGS. 15 to 17 show properties of some of the two-dimensional perovskites listed above for use as scintillators and/or photodetectors in accordance with embodiments of the invention.

FIG. 15 shows steady state absorption and luminescence of two-dimensional narrowband emitters using a) $(NBT)_2PbI_4$, b) $(PEA)_2PbI_4$ and c) $(NBT)_2PbBr_4$ respectively. The photoluminescence peak blue-shifts from about 520 nm to 410 nm from $(NBT)_2PbI_4$ to $(NBT)_2PbBr_4$, following the corresponding blue-shift of the absorption edges. The absorption spectrum of $(PEA)_2PbI_4$ in FIG. 15 (b) also shows a pronounced excitonic peak at 515 nm and a photoluminescence peak at 525 nm.

It is believed that all 2D perovskites will have a characteristic photoluminescence profile which depends on the interplay between free excitonic and polaronic emission. Those having mainly excitonic character will be narrowband emitters (such as those shown in FIG. 15); those having mainly polaronic behavior (due to formation of self-trapped excitons) will have highly Stokes' shifted (>50 nm), broad-band emission. However, there can be a co-existence of free and self-trapped excitons, giving rise to a double-peak luminescence as shown in FIG. 16. In this case, the relevant Stokes' shift (which is >50 nm) is measured from the polaronic emission peaks at around 510 nm and 525 nm, respectively for a) $(API)PbBr_4$ and b) $(EDBE)PbBr_4$, which are characteristic of broadband luminescence (not the closest excitonic emission peaks). In these embodiments, it does not matter if the excitonic peak is also present: the perovskite can still be used for its broadband (polaronic) luminescence with all the advantages discussed herein.

FIG. 16 shows steady state absorption and luminescence of two-dimensional broadband emitters using a) $(API)PbBr_4$ and b) $(EDBE)PbBr_4$ respectively. The photoluminescence of $(API)PbBr_4$ includes a generally twin peak structure with a broader peak at around 515 nm and a narrower peak at around 400 nm. The narrower peak has a double peak feature which includes a stronger peak at 389 nm and a weaker peak at 404 nm. The absorption edge of $(API)PbBr_4$ can be seen at 380 nm. On the other hand, the absorption spectrum of $(EDBE)PbBr_4$ in FIG. 16 shows a pronounced excitonic peak at around 375 nm and a main broadband, highly Stokes-shifted photoluminescence peak at around 525 nm. The photoluminescence of $(EDBE)PbBr_4$ also shows a much weaker satellite peak at around 405 nm. As shown in FIG. 16, a large Stokes' shift in these broadband two-dimensional perovskite emitters can be identified. Large Stokes' shifts generally result in low self-absorption in two-dimensional perovskites, which is advantageous since a thick crystal with a low self-absorption has much reduced loss in its light yield. Moreover, large Stokes' shifts also reduce decay times at room temperature as a result of a reduction in self-absorption. For example, decay times for $(EDBE)PbCl_4$ is less than 9 ns or less than 8 ns at room temperature as shown in FIG. 7. Furthermore, $(EDBE)PbBr4$ is highly attractive for use in embodiments of the invention as it is a 2D broadband perovskite with the highest photoluminescence quantum yield measured so far.

FIG. 17 shows examples of properties of two-dimensional perovskites in relation to their use as photovoltaics and/or photo-detectors in accordance with embodiments of the present invention. More specifically, (a) and (b) of FIG. 17 show UV-induced photocurrent measurements on (EDBE)$PbCl_4$ and (EDBE)$PbBr_4$ drop casted films respectively, while (c) and (d) of FIG. 17 illustrate the crystal and band structure obtained from ab-initio calculations of a layered copper perovskite $MA_2CuClBr_3$ respectively. In order to measure photocurrents for the (EDBE)$PbCl_4$ and (EDBE)$PbBr_4$ drop casted films, two gold contacts (channel length 200 µm) defining an active area of $6\times10^{-4}$ cm$^2$ were evaporated on top of each of the perovskite films. Light (e.g. UV light) was subsequently shined on the active area and charges were extracted through the application of an external bias (100 V for (EDBE)$PbCl_4$ and 30 V for (EDBE)$PbBr_4$). The photocurrents observed in FIG. 17 for (EDBE)$PbCl_4$ and (EDBE)$PbBr_4$ are comparable to the absorption spectrums of the respective perovskites (see e.g. FIG. 5), making these two-dimensional perovskites suitable for photo-detection of high energy radiation (e.g. UV and X-Rays).

The films for two-dimensional perovskites, such as (EDBE)$PbCl_4$ and (EDBE)$PbBr_4$, can be used in generally two device architectures: (i) a photovoltaic and (ii) a photoconductor. Thin-film photovoltaic cells (e.g. photodiodes), in which charge separation is achieved by a built-in potential of a p-i-n junction, exhibit a specific X-ray sensitivity that is commensurate with the performance of conventional solid-state semiconductor materials. For example, for externally biased thick-film photoconductors capable of absorbing a much larger portion of incident X-rays, a similarly high X-ray sensitivity can be obtained. Due to typically thin films, in a range of nanometers, formed by two-dimensional perovskites, photo-detectors manufactured from these films may be used for low energy X-rays and/or γ-rays.

Hybrid perovskites generally show exceptional optoelectronic properties, such as extremely long charge carrier lifetime and diffusion length, slow charge carrier recombination and high absorption coefficient. Moreover, perovskites can be easily and uniformly deposited by solution process methods (in contrast with traditional materials like amorphous Se, crystalline Si and CdTe), making them ideal candidates for development of cost effective, large-scale devices. In this regard, direct photon-to-current conversion has proven to be extremely effective for X-Rays and UV-Vis radiation detection using three-dimensional perovskites as active material in p-i-n type MAPbI3-based photodiodes (see e.g. references 10, 14 and 22).

In embodiments of the present invention, it is shown that two-dimensional perovskites can also effectively be used for photon-to-current conversion, and applied in photovoltaics and/or photodetectors. In an embodiment, the two-dimensional perovskites may be applied as a single crystal or a film. In particular, the high exciton binding energy induced by the multi-quantum-well structure advantageously makes two-dimensional perovskites more stable against thermal quenching compared to three-dimensional perovskites, thereby enabling higher conversion yield at room temperature. Referring to parts (a) and (b) of FIG. 17, the photocurrent measurements show that generally high exciton binding energies in two-dimensional perovskites do not preclude charge extraction from these materials, aiding charge separation when applying an external bias. While strong photocurrents from two-dimensional excitons have been previously shown in the visible light range using $(C_6H_9C_2H_4NH_3)_2PbI_4$ (see e.g. reference 42), in embodiments of the present invention, (EDBE)PbCl$_4$ and (EDBE)PbBr$_4$ can be applied to photodetectors selectively active in the UV spectral range. A similar approach may also be used for X-ray induced photocurrent for the realization of high-energy-radiation photodetectors.

As a result of self-assembled layered structures combined with charge confinement in wells formed in inorganic layers, two-dimensional perovskites are characterized by a strong anisotropy of charge transport properties. Referring to part (c) of FIG. 17, the crystal structure of an isostructural copper-based hybrid perovskite (e.g. $MA_2CuClBr_3$) is shown. The calculated effective masses are extremely high ($\infty$ and 2.39 for holes and electrons, respectively) for such a hybrid perovskite along the Z-direction (orthogonal to the perovskite layers), while the calculated effective masses are much lower (1.51 and 0.57 for holes and electrons, respectively) in the parallel Y-direction (see e.g. reference 41). This is a consequence of the flat band structure (as shown in part (d) of FIG. 17) of the isostructural copper-based hybrid perovskites which identifies that charge transport may be hampered in a direction orthogonal to the perovskite's layers, while it is much favoured in a direction parallel to the perovskite's layers (especially for electron transport in copper-based perovskites as in the case here). This intrinsic property of layered perovskites suggest that lateral contacts are preferred in two-dimensional perovskite crystals and films. In view of the intrinsic property of two-dimensional perovskites which hampers charge transport in a direction orthogonal to the perovskite's layers, functional organic cations (e.g. conjugated molecules) may be used to increase the charge coupling within adjacent inorganic planes and improve the charge transport in the orthogonal direction.

Typical two-dimensional perovskites show free-exciton, narrowband emissions (FWHM~20-30 nm) with very small Stokes shifts (~4-5 nm) which are due to direct band-to-band recombination. A selected group of two-dimensional perovskites is characterized by an opposite behaviour, showing highly Stokes-shifted, ultra-broadband luminescence. In this case, the luminescence is mediated by the formation of polaronic species deriving from charge self-trapping at specific sites of the inorganic lattice and are strongly related to structural distortions of the inorganic framework. Examples of such self-localized polarons include self-trapped holes (STH: e.g. $Pb^{3+}$, $X_2^-$), self-trapped electrons (STEL: e.g. $Pb_2^{3+}$) and VF centres (e.g. $I_3^-$) (see e.g. references 44 to 46). Therefore, the emission mechanism in narrowband and broadband perovskites is intrinsically different, being attributed to free-excitonic emission and polaronic emission, respectively. As such, it is not straightforward to conclude that the polaronic broadband emission in two-dimensional perovskites could be suitable for applications in X-ray scintillators.

X-ray detectors can work in two operating modes: A) photon down-conversion, where a scintillator material is coupled to a sensitive photodetector operating at lower photon energies; and/or B) photon-to-current conversion, where a semiconducting material directly converts the incoming radiation into electrical current. The demonstration that the same broadband material can also be used as photodetector shows that, in addition to the photon down-conversion in scintillators, the photon-to-current approach can also be applied as alternative method for X-ray detection. Therefore as shown in FIGS. 1 to 17, a same two-dimensional perovskite broadband material (e.g. (EDBE)PbCl$_4$) can be used for photon down-conversion in a scintillator as well as photo-to-current conversion in a photo-detector for X-ray detection.

Figure 18:
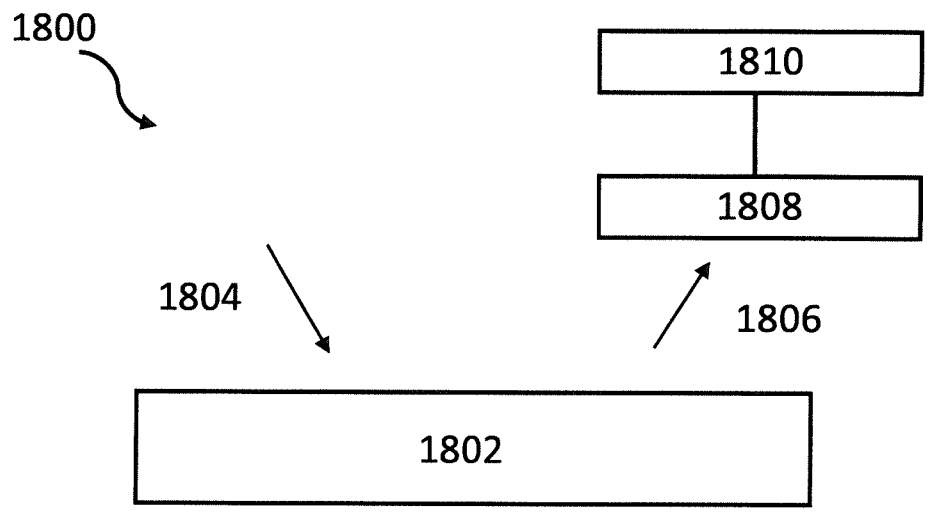
FIG. 18 shows an electro-magnetic wave detector in the form of a scintillator in accordance with an embodiment of the present invention.
Figure 19:
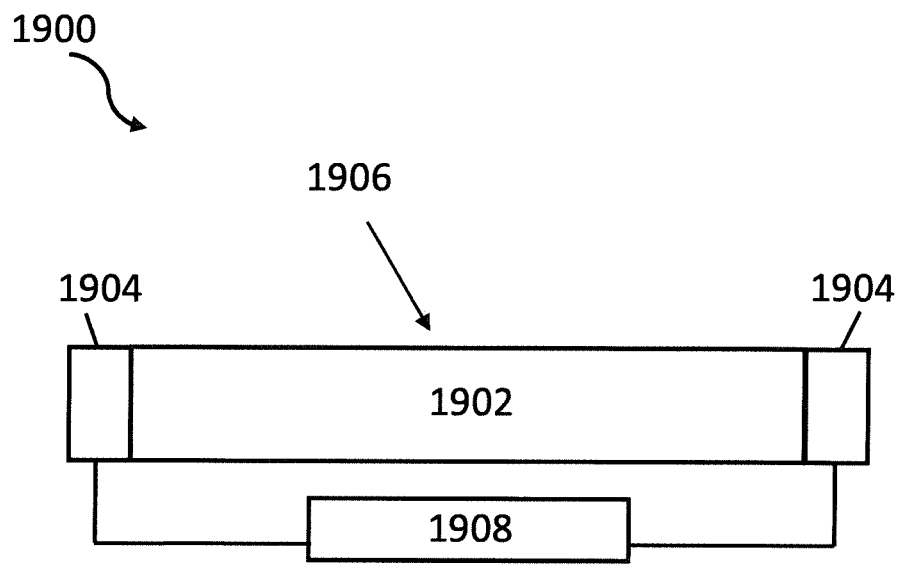
FIG. 19 shows an electro-magnetic wave detector in the form of a photo-detector in accordance with an embodiment of the present invention.

Examples of an electro-magnetic wave detector 1800, 1900 are shown in FIGS. 18 and 19.

Referring to FIG. 18, an embodiment of an electro-magnetic wave detector in the form of a scintillator is shown. The electro-magnetic wave detector 1800 comprises a scintillator 1802, where the scintillator 1802 is a material that exhibits scintillation upon excitation by an electro-magnetic radiation 1804. The scintillator 1802 may comprise a two-dimensional perovskite having a Stokes' shift of at least 50 nm. Examples of an electro-magnetic radiation are X-ray, UV-ray, visible light, and γ-ray. Examples of a scintillator 1802 is a two-dimensional perovskite as discussed at length in relation to FIGS. 1 to 17 above. In an embodiment, upon excitation by an electro-magnetic radiation 1804, the scintillator 1802 emits luminescence 1806 which is detected by a photo-detector 1808 where the luminescence 1806 is converted to electrical signals. The electrical signals may then be transmitted to a detector circuit 1810 electrically connected to the photo-detector 1808 where the electrical signals may be further processed and/or analysed.

Referring to FIG. 19, an embodiment of an electro-magnetic wave detector 1900 in the form of a photo-detector is shown. The photo-detector comprises an active layer 1902 and two electrical contacts 1904. The active layer 1902 may comprise a two-dimensional perovskite having a Stokes' shift of at least 50 nm. In an embodiment, the two electrical contacts 1904 are oppositely placed at either end of the active layer 1902. However, it is noted that the placement of the electrical contacts may vary depending on requirements for the photo-detector. In an embodiment, upon excitation by an electro-magnetic radiation 1906, the active layer 1902 of the photo-detector generates a photo-current. The photo-current is then collected at the electrical contacts 1904 where it is further transmitted to a detector circuit 1908 to be processed and/or analysed. Due to the layered structure in combination with charge confinement in wells formed in inorganic layers of a two-dimensional perovskite, it is advantageous to place the electrical contacts at either end of the active layer (e.g. a two-dimensional perovskite) to facilitate charge transport in a direction parallel to the two-dimensional perovskite's layers.

The electro-magnetic wave detector (either in the form of a scintillator or a photo-detector) may comprise a two-dimensional perovskite having a Stokes' shift of at least 50 nm to minimise loss due to re-absorption. Examples of two-dimensional perovskite have been discussed in relation to FIGS. 1 to 17 above. The two-dimensional perovskite comprised in the electro-magnetic wave detector may have a scintillation decay time at room temperature of less than 8 ns; of less than 7 ns; of less than 6 ns; or of less than 5 ns. The two-dimensional perovskite may be in the form of a single crystal or a film. The electro-magnetic wave detector may comprise a cation selected from the group of: EDBE; N-MEDA; API; AETU or CEA. The electro-magnetic wave detector may comprise one or more of: a halide; a Group IVa metal; a transition metal; a post-transition metal; or a lanthanide. The two-dimensional perovskite comprised in the electro-magnetic wave detector may be a layered hybrid perovskite of the Ruddlesden-Popper series with a general formula of $(A)_2(B)_{n-1}[Pb_nX_{3n+1}]$, where A is a bulky cation, B is a small cation and X is an anion. The two-dimensional perovskite comprised in the electro-magnetic wave detector may have a Stokes' shift of at least 100 nm; at least 200 nm or at least 300 nm. The electro-magnetic wave detector may comprise lateral contacts formed in a direction parallel to a layered structure of the two-dimensional perovskite (such as in FIG. 19). Alternatively, the two-dimensional perovskite may be doped with a functional organic cation and the electro-magnetic wave detector may comprise vertical contacts formed in a direction orthogonal to a layered structure of the two-dimensional perovskite.

Although only certain embodiments of the present invention have been described in detail, many variations are possible in accordance with the appended claims. For example, features described in relation to one embodiment may be incorporated into one or more other embodiments and vice versa.

REFERENCES

The following references are incorporated herein by reference, with regards to the background of the invention.
1. Blasse, G., Scintillator materials, *Chem. Mater.* 6, 1465-1475 (1994).
2. Nikl, M., Scintillation detectors for x-rays, *Meas. Sci. Technol.* 17, R37-R54 (2006).
3. Street, R. A., Ready, S. E., Van Schuylenbergh, K., Ho, J., Boyce, J. B., Nylen, P., Shah, K., Melekhov, L., and Hermon, H., Comparison of $PbI_2$ and $HgI_2$ for direct detection active matrix x-ray image sensors, *J. Appl. Phys.* 91, 3345-3355 (2002).
4. Szeles, C., CdZnTe and CdTe materials for X-ray and gamma ray radiation detector applications, *phys. stat. sol.* (b) 241, 783-790 (2004).
5. Kasap, S. and Rowlands, J., Direct-conversion flat-panel X-ray image sensors for digital radiography, *Proc. IEEE* 90, 591-604 (2002).
6. Büchele, P., Richter, M., Tedde, S. F., Matt, G. J., Ankah, G. N., Fischer, R., Biele, M., Metzger, W., Lilliu, S., Bikondoa, O., Macdonald, J. E., Brabec, C. J., Kraus, T., Lemmer, U., and Schmidt, O., X-ray imaging with scintillator-sensitized hybrid organic photodetectors, *Nature Photon.* 9, 843-848 (2015).
7. Heiss, W. and Brabec, C., X-ray imaging: Perovskites target X-ray detection, *Nature Photon.* 10, 288-289 (2016).
8. Tegze, M. and Faigel, G., X-ray holography with atomic resolution, *Nature* 380, 49-51 (1996).
9. Rieder, R., Economou, T., Wanke, H., Turkevich, A., Crisp, J., Bruckner, J., Dreibus, G., and McSween, H., The chemical composition of Martian soil and rocks returned by the mobile alpha proton x-ray spectrometer: Preliminary results from the x-ray mode, *Science* 278, 1771-1774 (1997).
10. Yakunin, S., Sytnyk, M., Kriegner, D., Shrestha, S., Richter, M., Matt, G. J., Azimi, H., Brabec, C. J., Stangl, J., Kovalenko, M. V., and Heiss, W., Detection of X-ray photons by solution-processed lead halide perovskites, *Nature Photon.* 9, 444-450 (2015).
11. Wei, H., Fang, Y., Mulligan, P., Chuirazzi, W., Fang, H.-H., Wang, C. , Ecker, B. R., Gao, Y., Loi, M. A., Cao, L., and Huang, J., Sensitive X-ray detectors made of methylammonium lead tribromide perovskite single crystals, *Nature Photon.* 10, 333-339 (2016).
12. Yakunin, S., Dirin, D. N., Shynkarenko, Y., Morad, V., Cherniukh, I., Nazarenko, O., Kreil, D., Nauser, T., and Kovalenko, M. V., Detection of gamma photons using solution-grown single crystals of hybrid lead halide perovskites, *Nature Photon.* AOP (2016).
13. Chin, X. Y., Cortecchia, D., Yin, J., Bruno, A., and Soci, C., Lead iodide perovskite light-emitting field-effect transistor, *Nature Comm.* 6, 7383-1-7383-9 (2015).
14. Dou, L., Yang, Y. M., You, J., Hong, Z., Chang, W. H., Li, G., and Yang, Y., Solution-processed hybrid perovskite photodetectors with high detectivity, *Nature Comm.* 5, 5404-1-5404-6 (2014).
15. Chondroudis, K. and Mitzi, D. B., Electroluminescence from an organic-inorganic perovskite incorporating a quaterthiophene dye within lead halide perovskite layers, *Chem. Mater.* 11, 3028-3030 (1999).
16. Tan, Z.-K., Moghaddam, R. S., Lai, M. L., Docampo, P., Higler, R., Deschler, F., Price, M., Sadhanala, A., Pazos, L. M., Credgington, D., Hanusch, F., Bein, T., Snaith, H. J., and Friend, R. H., Bright light-emitting diodes based on organometal halide perovskite, *Nature Nanotech.* 9, 687-692 (2014).
17. Xing, G., Mathews, N., Lim, S. S., Yantara, N., Liu, X., Sabba, D., Gratzel, M., Mhaisalkar, S. and Sum, T. C., Low-temperature solution-processed wavelength-tunable perovskites for lasing, *Nature Mater.* 13, 476-480 (2014).
18. Birowosuto, M. D. and Dorenbos, P., Novel γ- and X-ray scintillator research: on the emission wavelength, light yield and time response of $Ce^{3+}$ doped halide scintillators, *phys. stat. sol.* (a) 206, 9-20 (2009).
19. Drozdowski, W., Wojtowicz, A. J., Lukasiewicz, T., and Kisielewski, J., Scintillation properties of LuAP and LuYAP crystals activated with Cerium and Molybdenum, *Nucl. Instr. Meth. Phys. Res. A* 562, 254-261 (2006).
20. Shibuya, K., Koshimizu, M., Takeoka, Y., and Asai, K., Scintillation properties of $(C_6H_{13}NH_3)(2)PbI_4$: Exciton luminescence of an organic/inorganic multiple quantum 20. well structure compound induced by 2.0 MeV protons, *Nucl. Instr. Meth. Phys. Res. B* 194, 207-212 (2002).
21. Kishimoto, S., Shibuya, K., Nishikido, F., Koshimizu, M., Haruki, R., and Yoda, Y., Subnanosecond time-resolved x-ray measurements using an organic-inorganic perovskite scintillator, *Appl. Phys. Lett.* 93, 261901-1-261901-3 (2008).
22. Saidaminov, M. I., Abdelhady, A. L., Murali, B., Alarousu, E., Burlakov, V. M., Peng, W., Dursun, I., Wang, L., He, Y., Maculan, G., Goriely, A., Wu, T., Mohammed, O. F., and Bakr, O. M., High-quality bulk hybrid perovskite single crystals within minutes by inverse temperature crystallization, *Nature Comm.* 6, 7586-1-7586-6 (2015).
23. Shi, D., Adinolfi, V., Comin, R., Yuan, M., Alarousu, E., Buin, A., Chen, Y., Hoogland, S., Rothenberger, A., Katsiev, K., Losovyj, Y., Zhang, X., Dowben, P. A., Mohammed, O. F., Sargent, E. H., and Bakr, O. M., Low trap-state density and long carrier diffusion in organolead trihalide perovskite single crystals, *Science* 347, 519-522 (2015).
24. Dohner, E. R., Jaffe, A., Bradshaw, L. R., and Karunadasa, H. I., Intrinsic white-light emission from layered hybrid perovskites, *J. Am. Chem. Soc.* 136, 13154-13157 (2014).
25. van Loef, E. V. D., Dorenbos, P., van Eijk, C. W. E., Kramer, K. and Güdel, H. U., High-energy-resolution scintillator: $Ce^{3+}$ activated $LaBr_3$, *Appl. Phys. Lett.* 79, 1573-1-1573-3 (2001).
26. Birowosuto, M. D., Dorenbos, P., van Eijk, C. W. E., Krämer, K. W., and Güdel, H. U., Thermal quenching of $Ce^{3+}$ emission in $PrX_3$ (X=Cl, Br) by intervalence charge transfer, *J. Phys. Condens. Matter* 19, 256209-1-256209-16 (2007).
27. Birowosuto, M. D., Dorenbos, P. de Haas, J. T. M., van Eijk, C. W. E., Krämer, K. W., and Güdel, H. U., Optical spectroscopy and luminescence quenching of $LuI_3$: $Ce^{3+}$, *J. Lumin.* 118, 308-316 (2006).
28. Birowosuto, M. D., Dorenbos, P., van Eijk, C. W. E., Krämer, K. W., and Güdel, H. U., High-light-output scintillator for photodiode readout: $LuI_3$: $Ce^{3+}$, *J. Appl. Phys.* 99, 123520-1-123520-4 (2006).
29. Cortecchia, D., Yin, J., Lova, P., Mhaisalkar, S., Gurzadyan, G. G., Bruno, A., and Soci, C., Polaron self-localization in white-light emitting hybrid perovskites, arXiv:1603.01284 [cond-mat.mtrl-sci] (2016).
30. Birowosuto, M. D., Dorenbos, P., van Eijk, C. W. E., Krämer, K. W., and Güdel, H. U., $PrBr_3$: $Ce^{3+}$: A New Fast Lanthanide Trihalide Scintillator, *IEEE Trans. Nucl. Sci.* 53, 3028-3030 (2006).
31. van Eijk, C. W. E., de Haas, J. T. M., Rodnyi, P. A., Khodyuk, I. V., Shibuya, K., Nishikido, F., and Koshimizu, M., Scintillation properties of a crystal of $(C_6H_5(CH_2)_2NH_3)_2PbBr_4$, *IEEE Nuclear Science Symposium Conference Record* 2008, 3525-3528 (2008).
32. Bartram, R. H., Hamilton, D. S., Kappers, L., and Lempicki, A., Electron traps and transfer efficiency of cerium-doped aluminate scintillators, *J. Lumin.* 75, 183-192 (1997).
33. Drozdowski, W., Brylew, K., Witkowski, M. E., Wojtowicz, A. J., Solarz, P., Kamada, K., and Yoshikawa, A., "Studies of light yield as a function of temperature and low temperature thermoluminescence of $Gd_3Al_2Ga_3O_{12}$: Ce scintillator crystals, *Opt. Mater.* 36, 1665-1669 (2014).
34. Randall, J., and Wilkins, M., The phosphorescence of various solids, *Proc. Roy. Soc. London A* 184, 366-407 (1945).
35. Wojtowicz, A. J., Glodo, J., Drozdowski, W., and Przegietka, K. R., Electron traps and scintillation mechanism in $YAlO_3$: Ce and $LuAlO_3$: Ce scintillators *J. Lumin.* 79, 275-291 (1998).
36. Ogorodnikov, I. N. and Poryvai, N. E., Thermoluminescence kinetics of lithium borate crystals, *J. Lumin.* 132, 1318-1324 (2012).
37. Liu, C., Qi, Z., Ma, C.-g., Dorenbos, P., Hou, D., Zhang, S., Kuang, X., Zhang, J., and Liang, H., High light yield of $Sr_8(Si_4O_{12})Cl_8$: $Eu^{2+}$ under x-ray excitation and its temperature-dependent luminescence characteristics *Chem. Mater.* 26, 3709-3715 (2014).
38. Sutter-Fella, C. M., Li, Y., Amani, M., Ager III, J. W., Toma, F. M., Yablonovitch, E., Sharp, I. D., and Javey, A., High photoluminescence quantum yield in band gap tunable bromide containing mixed halide perovskites, *Nano Lett.* 16, 800-806 (2016).
39. Kolk, E. V. D. and Dorenbos, P., Systematic and material independent variation of electrical, optical, and chemical properties of Ln materials over the Ln series (Ln) La, Ce, Pr, . . . , Lu, *Chem. Mater.* 18, 3458-3462 (2006).
40. Birowosuto, M. D., Dorenbos, P., van Eijk, C. W. E., Kramer, K. W., and Güdel, H. U., $Ce^{3+}$ activated $LaBr_{3-x}I_x$: High-light-yield and fast-response mixed halide scintillators, *J. Appl. Phys.* 103, 103517-1-103517-6 (2008).
41. Cortecchia, D., Dewi, H. A., Yin, J., Bruno, A., Chen, S., Baikie, T., Boix, P. P., Grätzel, M., Mhaisalkar, S., Soci, C., and Mathews, N., *Inorganic Chemistry* 2016, 55, 1044.
42. Ahmad, S., Kanaujia, P. K., Beeson, H. J., Abate, A., Deschler, F., Credgington, D., Steiner, U., Prakash, G. V., and Baumberg, J. J., *ACS Applied Materials & Interfaces* 2015, 7, 25227.
43. Birowosuto, M. D., Cortecchia, D., Drozdowski, W., Brylew, K., Lachmanski, W., Bruno. A., and Soci, C., X-ray Scintillation in Lead Halide Perovskite Crystals *Scientific Reports* 6, 37254 (2016).
44. D. Cortecchia et al, *J. Mater. Chem. C*, 5, 2771-2780 (2017).
45. D. Cortecchia et al, *J. Am. Chem. Soc.*, 139 (1), pp 39-42 (2017).
46. J. Yin et al, *ACS Energy Lett.*, 2 (2), pp 417-423 (2017).

The invention claimed is:
1. A radiation detector comprising:
 a two-dimensional halide perovskite having a polaronic emission Stokes' shifted by at least 50 nm to minimise loss due to re-absorption.
2. The radiation detector according to claim 1, wherein the two-dimensional halide perovskite has a scintillation decay time at room temperature of one of: 8 ns or less; 7 ns or less; 6 ns or less; and 5 ns or less.
3. The radiation detector according to claim 1, configured as a scintillator.
4. The radiation detector according to claim 1, or claim 2 configured as a photodetector.
5. The radiation detector according to claim 1, wherein the two-dimensional halide perovskite is in the form of a single crystal.
6. The radiation detector claim 1, wherein the two-dimensional halide perovskite is in the form of a film.
7. The radiation detector according to claim 1, comprising a cation selected from the group of: EDBE; N-MEDA; API; AETU or CEA.
8. The radiation detector according to claim 1, comprising one or more of: a halide; a Group IVa metal; a transition metal; a post-transition metal; or a lanthanide.

9. The radiation detector according to claim 1, wherein the two-dimensional halide perovskite is a layered hybrid perovskite of the Ruddlesden-Popper series with a general formula of $(A)_2(B)_{n-1}[Pb_nX_{3n+1}]$, where A is a bulky cation, B is a small cation and X is an anion.

10. The radiation detector according to claim 1, wherein the two-dimensional halide perovskite has a polaronic emission Stokes' shifted by at least 100 nm; at least 200 nm or at least 300 nm.

11. The radiation detector to claim 1, comprising lateral contacts formed in a direction parallel to a layered structure of the two-dimensional halide perovskite.

12. The radiation detector according to claim 1, wherein the two-dimensional halide perovskite is doped with a functional organic cation and the radiation detector comprises vertical contacts formed in a direction orthogonal to a layered structure of the two-dimensional halide perovskite.

13. The radiation detector according to claim 1, configured for broadband luminescence with a full width at half maximum (FWHM) of at least 50 nm.

14. The radiation detector according to claim 1, configured for broadband luminescence with a full width at half maximum (FWHM) of at least 100 nm.

* * * * *